US008048700B2

(12) United States Patent
Tanaka

(10) Patent No.: US 8,048,700 B2
(45) Date of Patent: Nov. 1, 2011

(54) SEMICONDUCTOR LIGHT EMITTING ELEMENT AND MANUFACTURING METHOD THEREOF

(75) Inventor: Akimasa Tanaka, Hamamatsu (JP)

(73) Assignee: Hamamatsu-shi Photonics K.K., Hamamatsu-shi, Shizuoka (JP)

( * ) Notice: Subject to any disclaimer, the term of this patent is extended or adjusted under 35 U.S.C. 154(b) by 116 days.

(21) Appl. No.: 12/654,983

(22) Filed: Jan. 12, 2010

(65) Prior Publication Data

US 2010/0203660 A1 Aug. 12, 2010

Related U.S. Application Data

(62) Division of application No. 11/578,251, filed as application No. PCT/JP2005/007095 on Apr. 12, 2005, now Pat. No. 7,723,742.

(30) Foreign Application Priority Data

Apr. 13, 2004 (JP) ................................ P2004-118205

(51) Int. Cl.
*H01L 21/84* (2006.01)
(52) U.S. Cl. ............... 438/46; 257/98; 257/E33.067; 257/E33.069; 257/E21.087; 257/E21.22
(58) Field of Classification Search .................. 257/86, 257/98, 103, E33.005, E33.067, E33.069, 257/E21.087, E21.22; 438/29, 46
See application file for complete search history.

(56) References Cited

U.S. PATENT DOCUMENTS

| 4,956,683 | A | 9/1990 | Quintana |
| 5,373,520 | A | 12/1994 | Shoji et al. |
| 5,376,580 | A | 12/1994 | Kish et al. |
| 5,696,389 | A | 12/1997 | Ishikawa et al. |
| 5,724,376 | A | 3/1998 | Kish, Jr. et al. |
| 5,837,561 | A | 11/1998 | Kish, Jr. et al. |
| 6,282,219 | B1 | 8/2001 | Butler et al. |
| 6,781,152 | B2 * | 8/2004 | Yamazaki ............... 257/59 |
| 2002/0053872 | A1 | 5/2002 | Yang et al. |
| 2002/0137245 | A1 | 9/2002 | Kitamura et al. |
| 2003/0034497 | A1 * | 2/2003 | Yamazaki et al. ........... 257/86 |
| 2003/0047737 | A1 | 3/2003 | Lin et al. |
| 2004/0012028 | A1 | 1/2004 | Park et al. |
| 2004/0016932 | A1 | 1/2004 | Kondo |
| 2004/0188789 | A1 | 9/2004 | Koyama et al. |
| 2005/0017255 | A1 * | 1/2005 | Yamazaki ............... 257/84 |
| 2005/0018741 | A1 | 1/2005 | Nomaguchi |
| 2007/0241354 | A1 | 10/2007 | Tanaka |
| 2008/0299744 | A1 * | 12/2008 | Yamazaki et al. ........... 438/458 |

FOREIGN PATENT DOCUMENTS

EP 1 160 891 12/2001
(Continued)

*Primary Examiner* — Allan R Wilson
(74) *Attorney, Agent, or Firm* — Drinker Biddle & Reath LLP

(57) ABSTRACT

A semiconductor light-emitting device (LE1) comprises a multilayer structure LS generating light. This multilayer structure includes a plurality of laminated compound semiconductor layers (3 to 8) and has first and second main faces (61, 62) opposing each other. A first electrode (21) and a second electrode (31) are arranged on the first and second main faces, respectively. A film made of silicon oxide (10) is also formed on the first main face so as to cover the first electrode. A glass substrate (1) optically transparent to the light generated by the multilayer structure is secured to the multilayer structure through the film made of silicon oxide.

10 Claims, 18 Drawing Sheets

FOREIGN PATENT DOCUMENTS

| | | |
|---|---|---|
| JP | 2-128481 | 5/1990 |
| JP | 06-326353 | 11/1994 |
| JP | 7-170027 | 7/1995 |
| JP | 08-111559 | 4/1996 |
| JP | 8-255933 | 10/1996 |
| JP | 9-293893 | 11/1997 |
| JP | 10-200200 | 7/1998 |
| JP | 11-46038 | 2/1999 |
| JP | 11-154774 | 6/1999 |
| JP | 11-168262 | 6/1999 |
| JP | 2002-015873 | 1/2002 |
| JP | 2002-158373 | 5/2002 |
| JP | 2002-185071 | 6/2002 |
| JP | 2002-280614 | 9/2002 |
| JP | 2002-353564 | 12/2002 |
| JP | 2002-368334 | 12/2002 |
| JP | 2003-273463 | 9/2003 |
| WO | WO 02/41406 A1 | 5/2002 |

* cited by examiner

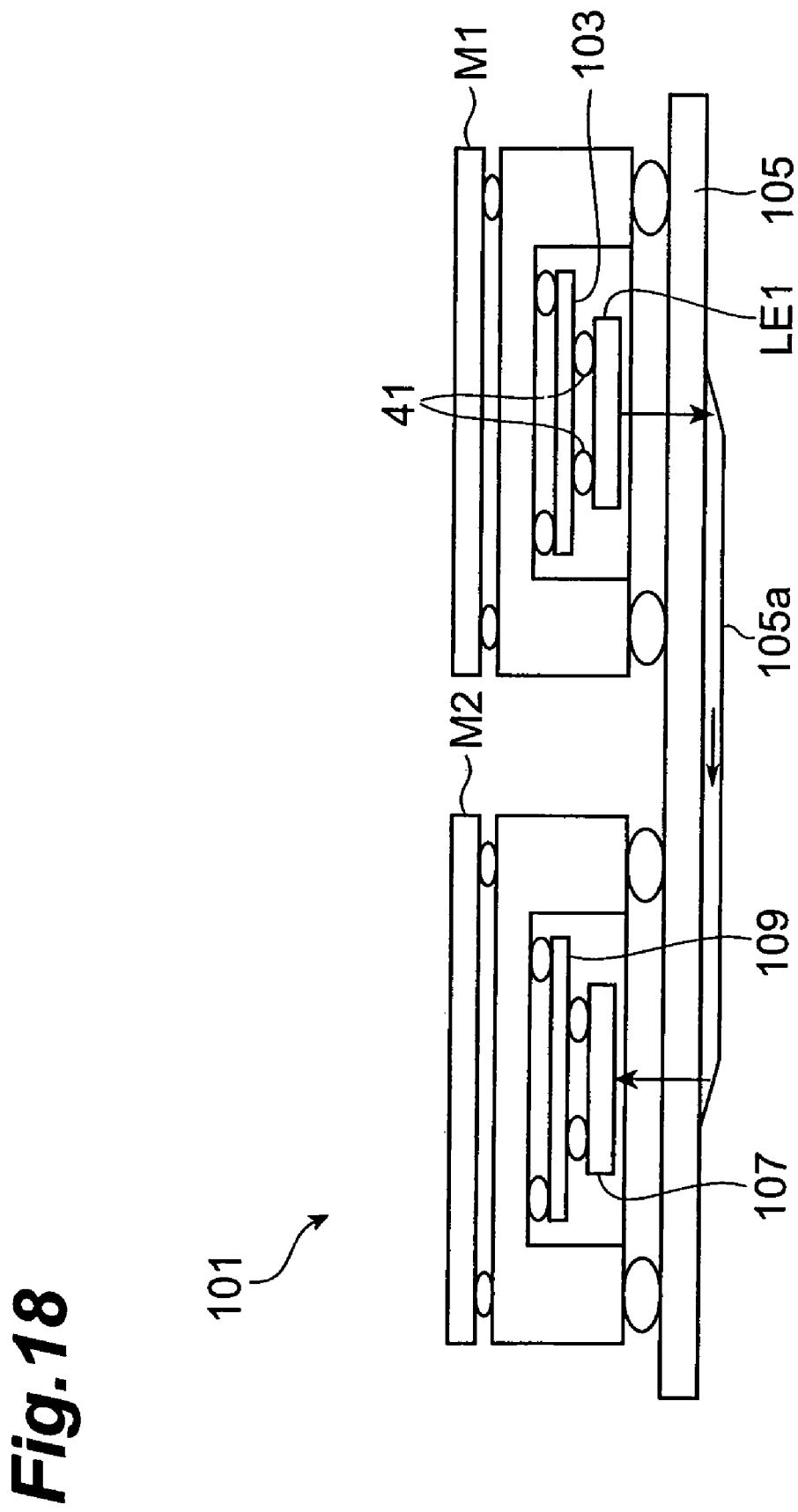

SEMICONDUCTOR LIGHT EMITTING ELEMENT AND MANUFACTURING METHOD THEREOF

This is a divisional application of copending application Ser. No. 11/578,251, having a §371 date of Jun. 19, 2007 now U.S. Pat. No. 7,723,742, which is a national stage filing based on PCT International Application No. PCT/JP2005/007095, filed on Apr. 12, 2005. The copending application Ser. No. 11/578,251 is incorporated by reference herein in its entirety.

TECHNICAL FIELD

The present invention relates to a semiconductor light-emitting device and a method of manufacturing the same.

BACKGROUND ART

Recently, as the CPU driving frequency has been becoming higher (e.g., 10 GHz or higher), attention has been directed toward optical interconnection techniques in which signals within and between system apparatus are transmitted by light. Semiconductor devices such as semiconductor photodetector devices and semiconductor light-emitting devices are used in the optical interconnection techniques.

Japanese Patent Application Laid-Open Nos. HEI 2-128481, 10-200200, and 11-46038 disclose so-called back-emitting semiconductor light-emitting devices each comprising a substrate and a plurality of compound semiconductor layers laminated on one of main faces of the substrate and emitting light from the other main face of the substrate. For the following purposes, the portion of substrate positioned under the light-emitting region is partially thinned in these semiconductor light-emitting devices, while a part maintaining the substrate thickness is formed so as to surround the above-mentioned part. The first purpose is to prevent optical signals from deteriorating or disappearing because of optical absorption of the substrate. The second purpose is to prevent the semiconductor devices from being damaged or broken when mounted onto an external substrate by wire-bonding or bump-bonding.

DISCLOSURE OF THE INVENTION

Since the part maintaining the substrate thickness exists, however, there is a limit to minimizing the size of the above-mentioned semiconductor light-emitting devices. When forming a light-emitting device array by arranging a plurality of light-emitting parts in a row in particular, the pitch between the light-emitting parts is hard to narrow, which inevitably increases the size of the light-emitting device array.

It is an object of the present invention to provide a semiconductor light-emitting device which has a sufficient mechanical strength and can be made smaller, and a method of manufacturing the same.

The semiconductor light-emitting device in accordance with the present invention comprises a multilayer structure including a plurality of laminated semiconductor layers, having first and second main faces opposing each other, and generating light; a first electrode arranged on the first main face of the multilayer structure; a second electrode arranged on the second main face of the multilayer structure; a film made of silicon oxide and formed on the first main face so as to cover the first electrode; and a glass substrate, optically transparent to the light generated by the multilayer structure, secured to the multilayer structure through the film made of silicon oxide.

Even when the plurality of compound semiconductor layers included in the multilayer structure are made thin, the mechanical strength of the multilayer structure is held by the glass substrate. Unlike the prior art mentioned above, it is not necessary to form a part keeping the substrate thickness, whereby the device can easily be made smaller.

Since silicon oxide can be fused to glass, the multilayer structure and the glass substrate can be bonded together without using any other adhesives. Therefore, light emitted from the multilayer structure can reach the glass substrate without being absorbed by adhesives.

Preferably, the film made of silicon oxide has a flat surface in contact with the glass substrate. Since irregularities due to the first electrode are eliminated by the film made of silicon oxide, the glass substrate can be attached easily and reliably to the first main face of the multilayer structure through the film made of silicon oxide.

The multilayer structure may include a contact layer of a first conductive type, a first distributed Bragg reflector (DBR) layer of the first conductive type, a first cladding layer of the first conductive type, an active layer, a second cladding layer of a second conductive type, and a second DBR layer of the second conductive type successively laminated as the plurality of compound semiconductor layers. The multilayer structure may have a multilayer region partially including the contact layer, first DBR layer, first cladding layer, active layer, and second cladding layer; and an insulated or semi-insulated current-narrowing region surrounding the multilayer region. In this case, a surface-emitting semiconductor light-emitting device can be obtained.

The semiconductor light-emitting device in accordance with the present invention may further comprise a first pad electrode arranged on the second main face of the multilayer structure, and a through lead penetrating through the multilayer structure. The first electrode may include a wiring electrode electrically connected to a part included in the multilayer region in the contact layer, the wiring electrode being electrically connected to the first pad electrode through the through lead. The second electrode may include a second pad electrode electrically connected to the second DBR layer. Since the first and second pad electrodes are arranged on the side opposite from the light exit surface, the semiconductor light-emitting device can be mounted easily.

The semiconductor light-emitting device in accordance with the present invention may further comprise respective bump electrodes arranged on the first and second pad electrodes.

The multilayer structure may have a plurality of multilayer regions arranged in a row.

The semiconductor light-emitting device in accordance with the present invention may further comprise a light-reflecting film, provided on the second DBR layer, covering the multilayer region. Light reflected by the light-reflecting film is also emitted from the glass substrate, whereby the emission output improves.

The glass substrate may have front and rear faces. The front face of the glass substrate may be secured to the film made of silicon oxide. The rear face of the glass substrate may have a lens part for receiving the light emitted from the multilayer structure. The lens part may be depressed from the thickest part in the rear face of the glass substrate.

The method of manufacturing a semiconductor light-emitting device in accordance with the present invention comprises the steps of preparing a semiconductor substrate; providing a multilayer structure for generating light onto the semiconductor substrate, the multilayer structure including a plurality of laminated compound semiconductor layers and having first and second main faces opposing each other, the second main face facing the semiconductor substrate; forming a first electrode on the first main face of the multilayer structure; forming a film made of silicon oxide so as to cover the first electrode; preparing a glass substrate, optically transparent to the light generated by the multilayer structure, having front and rear faces, and fusing the film made of silicon oxide to the front face of the glass substrate, so as to secure the multilayer structure to the glass substrate; removing the semiconductor substrate; and forming a second electrode on the second main face of the multilayer structure.

In this method, the film made of silicon oxide is formed on the first main face of the multilayer structure so as to cover the first electrode, this film is fused to the glass substrate, and then the semiconductor substrate is removed. This can easily manufacture a semiconductor light-emitting device having a structure in which the glass substrate is secured to the first main face of the multilayer structure through the film made of silicon oxide.

Since the glass substrate also exists after the semiconductor substrate is removed, the mechanical strength of the multilayer structure is held by the glass substrate even when the plurality of semiconductor layers included in the multilayer structure are made thin. Also, unlike the prior art mentioned above, it is not necessary to form a part keeping the substrate thickness, whereby the device can easily be made smaller. Before securing the glass substrate to the multilayer structure, the mechanical strength is held by the semiconductor substrate.

Since the glass substrate is fused to the film made of silicon oxide, the multilayer structure and the glass substrate can be bonded together without using any other adhesives. Therefore, light emitted from the multilayer structure can reach the glass substrate without being absorbed by adhesives.

The method in accordance with the present invention may further comprise the step of flattening the film made of silicon oxide before securing the multilayer structure to the glass substrate after forming the film made of silicon oxide. Since irregularities due to the first electrode are eliminated by the film made of silicon oxide, the glass substrate can be attached easily and reliably to the first main face of the multilayer structure through the film made of silicon oxide.

The step of removing the semiconductor substrate may include the step of removing the semiconductor substrate by wet etching.

The method in accordance with the present invention may further comprise the steps of forming an etching stop layer for stopping the wet etching on the semiconductor substrate before the step of forming the multilayer structure; and removing the etching stop layer by wet etching after the step of removing the semiconductor substrate. The step of forming the multilayer structure may include the step of forming the multilayer structure on the etching stop layer. When an etchant which can etch the semiconductor substrate but not the etching stop layer and an etchant which can etch the etching stop layer but not the compound semiconductor layer are used selectively as appropriate, the semiconductor substrate can be removed, and then the etching stop layer can be removed alone. Therefore, the semiconductor substrate can be removed reliably and easily while leaving the multilayer structure.

The multilayer structure may include a contact layer of a first conductive type, a first distributed Bragg reflector (DBR) layer of the first conductive type, a first cladding layer of the first conductive type, an active layer, a second cladding layer of a second conductive type, and a second DBR layer of the second conductive type as the plurality of compound semiconductor layers. The step of forming the multilayer structure may include the step of successively laminating the second DBR layer, second cladding layer, active layer, first cladding layer, first DBR layer, and contact layer on the semiconductor substrate. The method in accordance with the present invention may further comprise the step of forming an insulated or semi-insulated current-narrowing region surrounding a multilayer region partially including the contact layer, first DBR layer, first cladding layer, active layer, and second cladding layer in the multilayer structure after the step of forming the multilayer structure. In this case, a surface-emitting semiconductor light-emitting device is obtained.

The step of forming the first electrode may include the step of forming a wiring electrode electrically connected to a part included in the multilayer region in the contact layer after the step of forming the current-narrowing region. The step of forming the second electrode may include the step of forming a second pad electrode electrically connected to the second DBR layer. The method in accordance with the present invention may further comprise the step of forming a first pad electrode on the second main face of the multilayer structure and electrically connecting the first pad electrode and the wiring electrode to each other after the step of removing the semiconductor substrate. Since the first and second pad electrodes are arranged on the side opposite from the light exit surface, the semiconductor light-emitting device can be mounted easily.

The step of electrically connecting the first pad electrode and wiring electrode to each other may include the step of forming a through lead penetrating through the multilayer structure, and electrically connecting the first pad electrode to the wiring electrode through the through lead. In this case, the first pad electrode can be electrically connected to the wiring electrode in a reliable fashion.

The method in accordance with the present invention may further comprise the step of forming a light-reflecting film covering the multilayer region onto the second DBR layer. In this case, light reflected by the light-reflecting film is also emitted from the glass substrate, whereby the emission output can be improved.

The rear face of the glass substrate may have a lens part for receiving the light emitted from the multilayer structure. In this case, the lens part can ameliorate the directivity of emitted light and yield parallel light.

The lens part may be depressed from the thickest part in the rear face of the glass substrate. In this case, the glass substrate having the lens part can easily be fused to the film made of silicon oxide. When the lens part is processed before fusion, the method of processing lenses is less likely to be limited, whereby the degree of freedom in designing lenses in terms of lens forms and the like increases.

The present invention will be understood more fully from the following detailed descriptions and accompanying drawings. However, the drawings are given by illustration only and are not meant to limit the technical scope of the invention.

BRIEF DESCRIPTION OF THE DRAWINGS

FIG. 18 is a schematic view showing the structure of the optical interconnection system in accordance with an embodiment.

EXPLANATIONS OF NUMERALS OR LETTERS

1 ... glass substrate; 1a ... lens part; 3 ... contact layer; 4 ... first DBR layer; 5 ... first cladding layer; 6 ... active layer; 7 ... second cladding layer; 8 ... second DBR layer; 10 ... film made of silicon oxide; 11b ... light-emitting region; 11a ... current-narrowing region; 12 ... multilayer region; 21 ... first electrode; 23 ... p-side electrode; 25 ... wiring electrode; 27 ... through lead; 29 ... p-side pad electrode; 31 ... second electrode; 33 ... n-side pad electrode; 41 ... bump electrode; 51 ... semiconductor substrate; 53 ... etching stop layer; 61 ... first main face; 62 ... second main face; 71 ... glass substrate front face; 72 ... glass substrate rear face; 72a ... lens part; LE1, LE2 ... semiconductor light-emitting device; LE3 to LE6 ... semiconductor light-emitting device array; LS ... multilayer structure; TH ... through hole.

BEST MODES FOR CARRYING OUT THE INVENTION

The semiconductor light-emitting devices in accordance with embodiments of the present invention will be explained with reference to the drawings. Constituents identical to each other or those having functions identical to each other will be referred to with numerals identical to each other without repeating their overlapping descriptions.

First Embodiment

Figure 1:
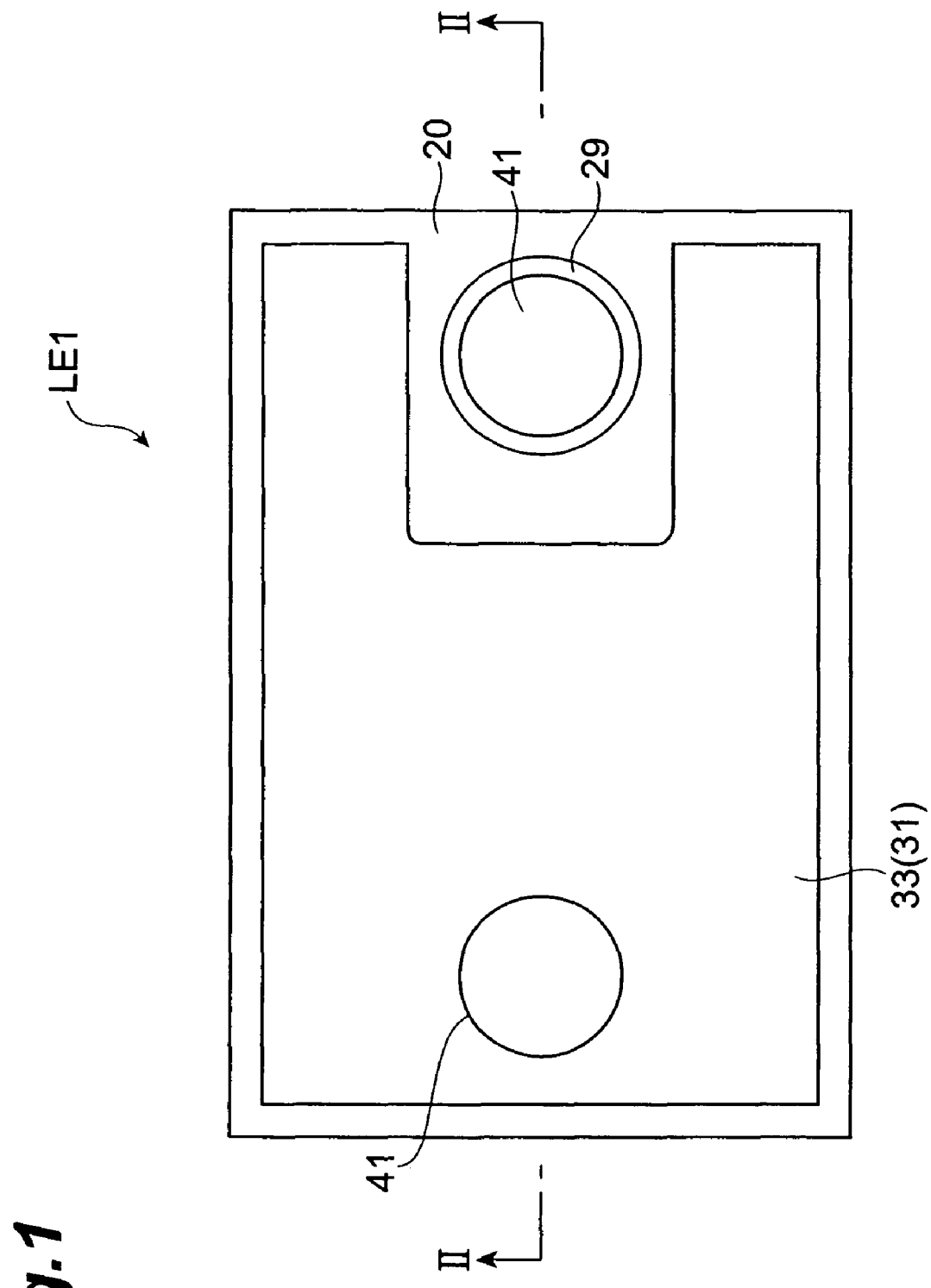
FIG. 1 is a schematic plan view showing the semiconductor light-emitting device in accordance with a first embodiment.
Figure 2:
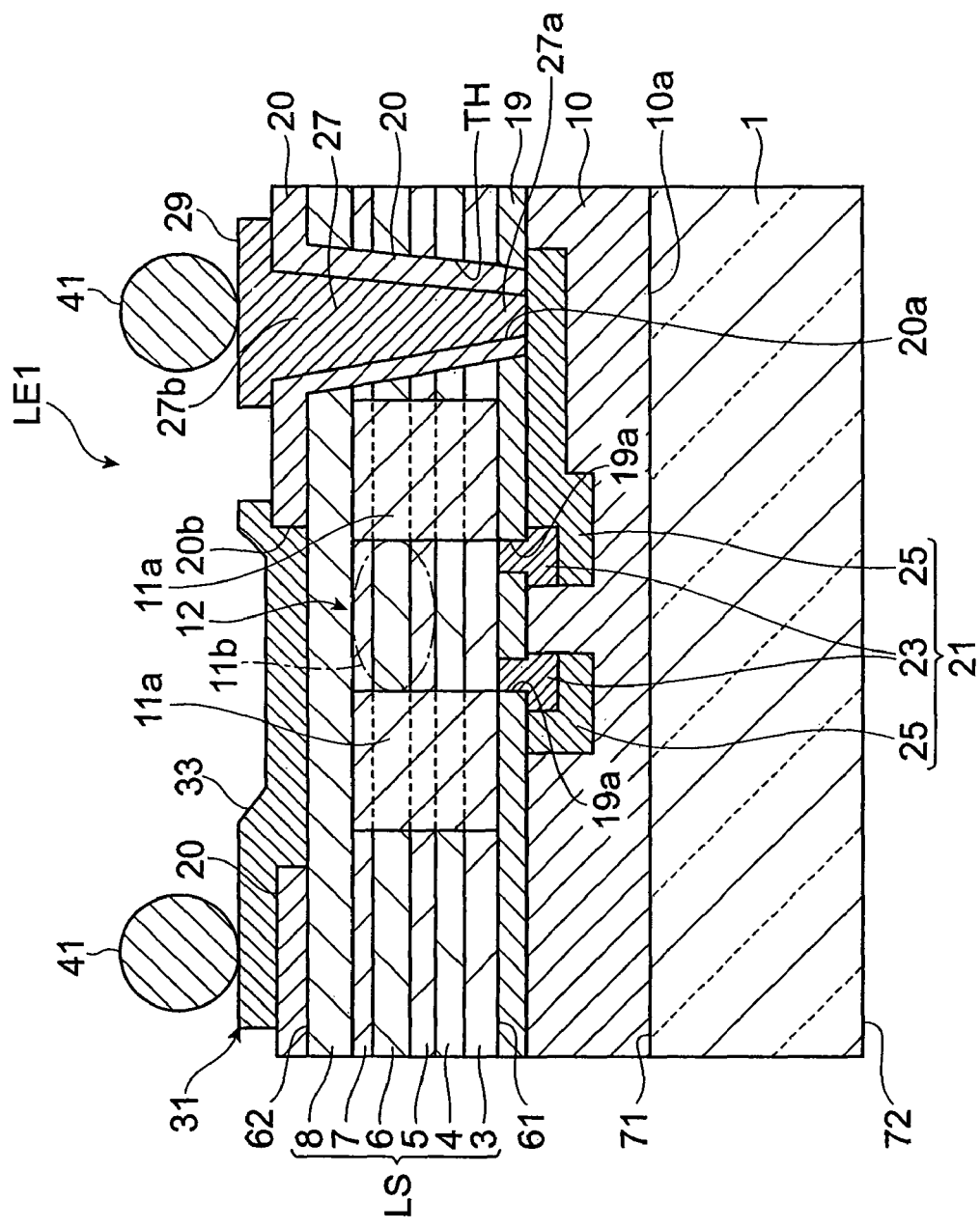
FIG. 2 is a schematic sectional view taken along the line II-II in FIG. 1.
Figure 3:
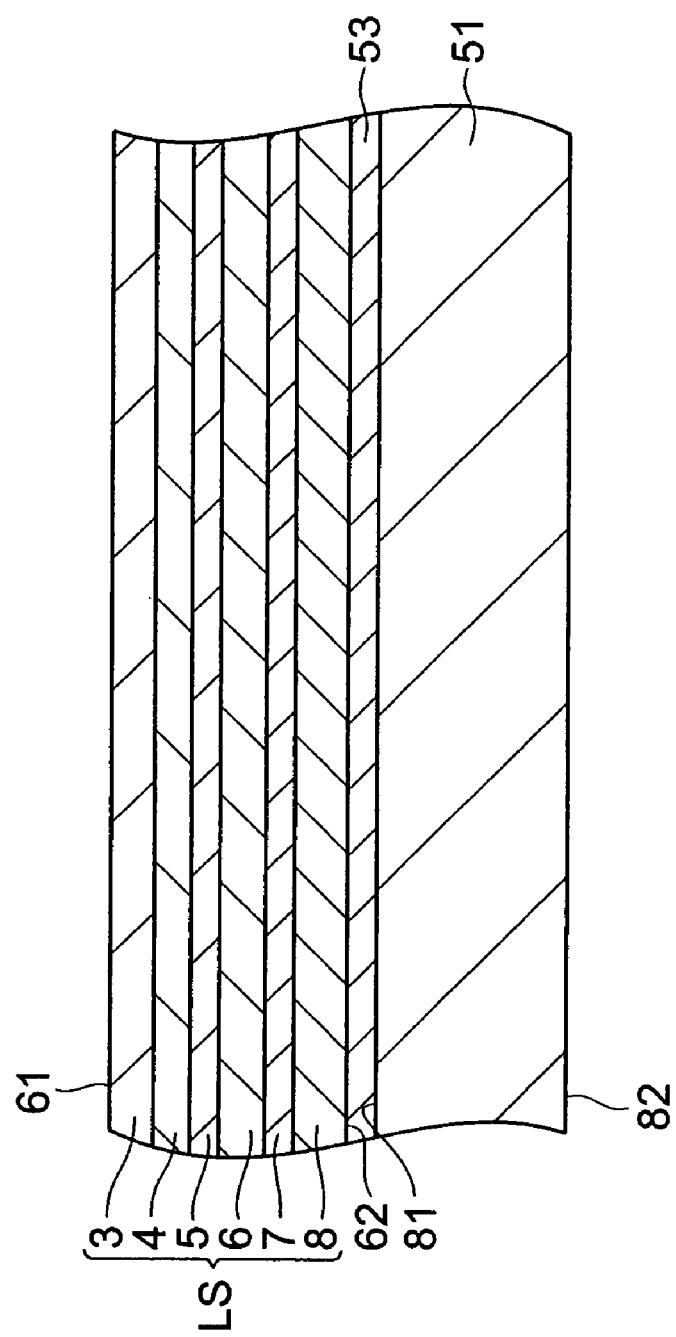
FIG. 3 is a schematic sectional view showing a step of manufacturing the semiconductor light-emitting device in accordance with the first embodiment.
Figure 4:
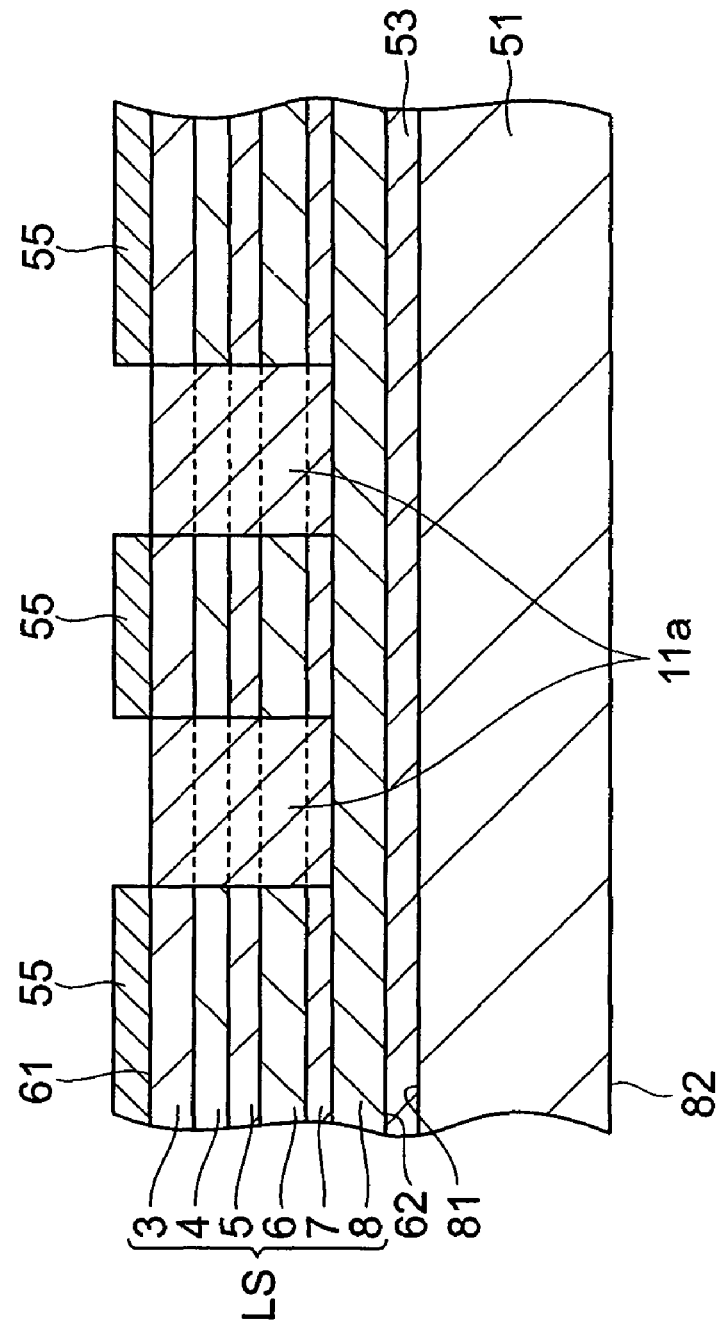
FIG. 4 is a schematic sectional view showing a step of manufacturing the semiconductor light-emitting device in accordance with the first embodiment.
Figure 5:
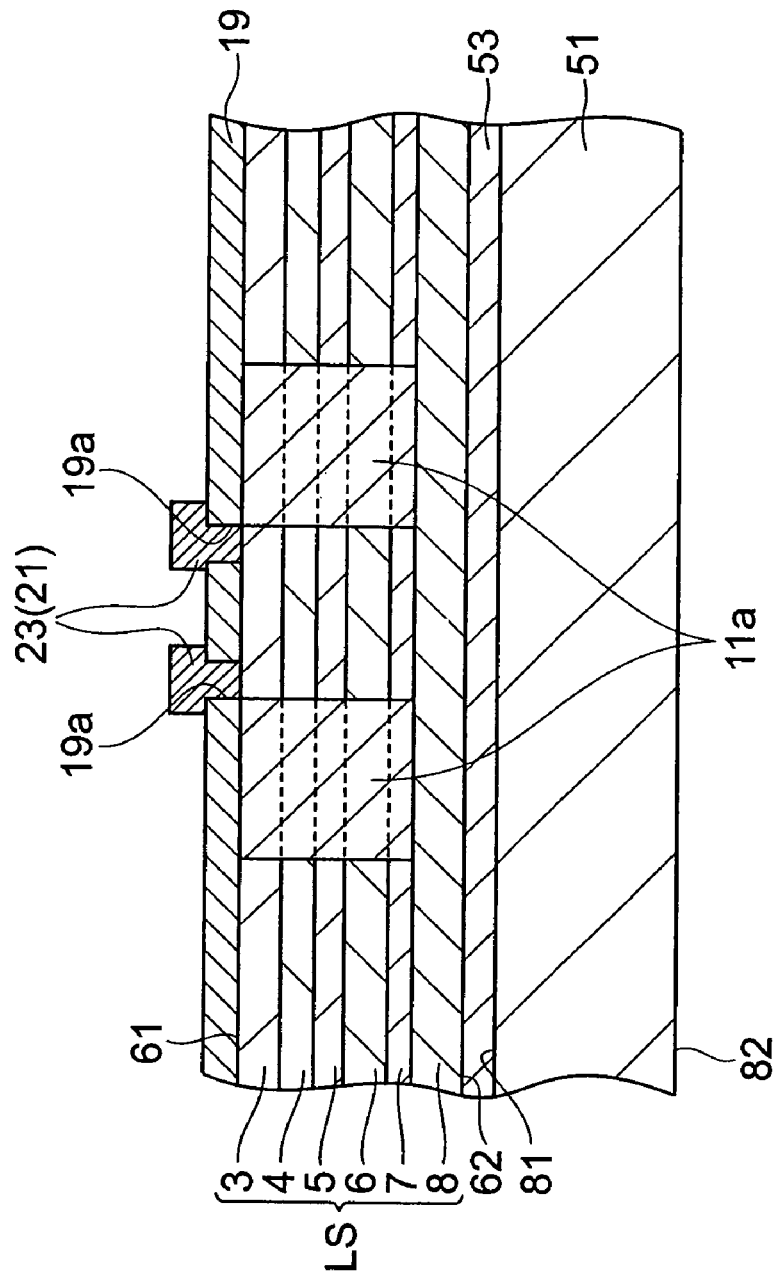
FIG. 5 is a schematic sectional view showing a step of manufacturing the semiconductor light-emitting device in accordance with the first embodiment.
Figure 6:
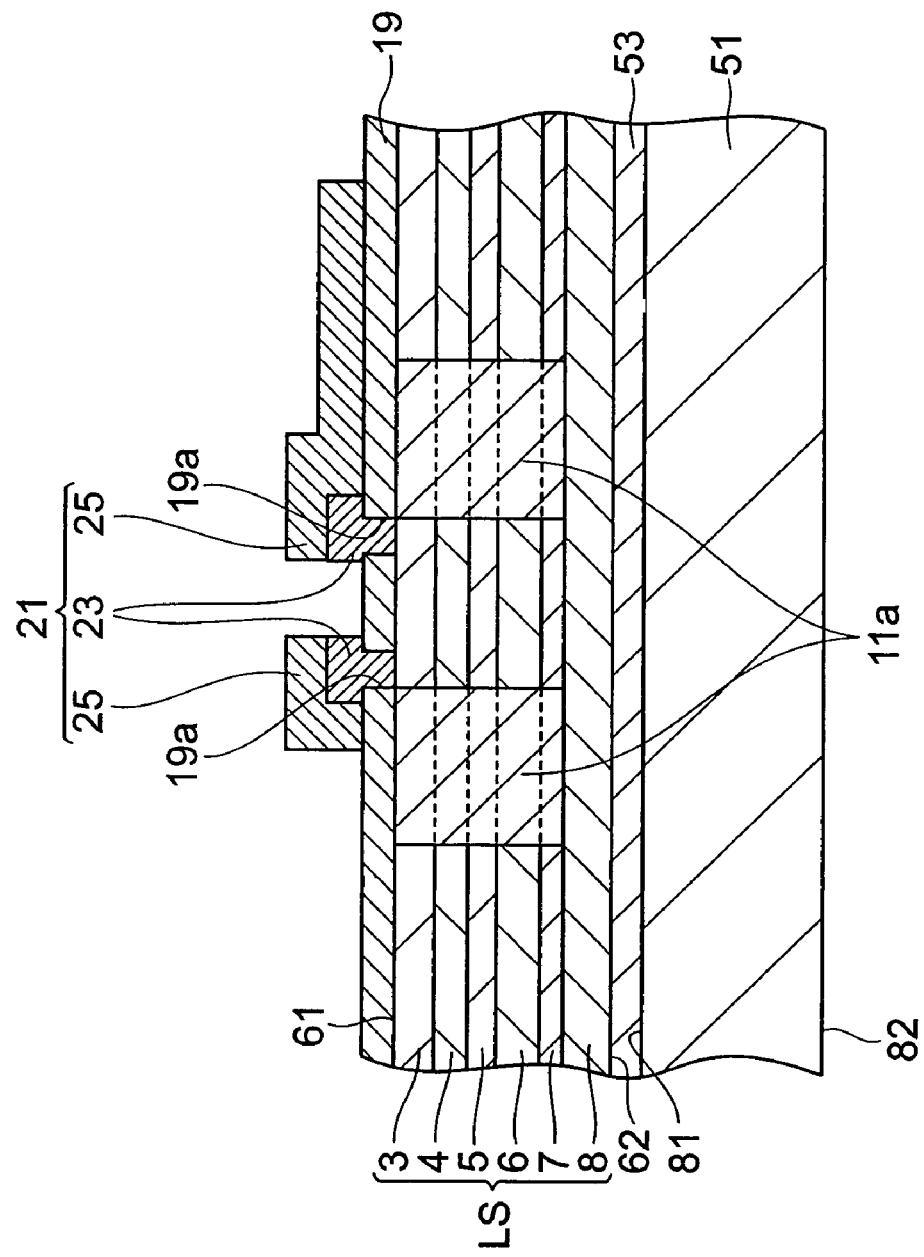
FIG. 6 is a schematic sectional view showing a step of manufacturing the semiconductor light-emitting device in accordance with the first embodiment.

FIG. 1 is a schematic plan view showing the semiconductor light-emitting device in accordance with a first embodiment. FIG. 2 is a schematic sectional view taken along the line II-II in FIG. 1.

The semiconductor light-emitting device LE1 comprises a multilayer structure LS and a glass substrate 1. This semiconductor light-emitting device LE1 is a vertical cavity surface emitting laser (VCSEL) of back emission type which emits light from the glass substrate 1 side. The semiconductor light-emitting device LE1 is a light-emitting device for short-distance optical communications in the wavelength band of 0.85 µm, for example.

The multilayer structure LS includes a p-type (first conductive type) contact layer 3, a p-type first distributed Bragg reflector (DBR) layer 4, a p-type first cladding layer 5, an active layer 6, an n-type (second conductive type) second cladding layer 7, and an n-type second DBR layer 8. The multilayer structure LS is formed with an insulated or semi-insulated current-narrowing region 11a. The current-narrowing region 11a is arranged so as to surround a multilayer region 12 partly including the contact layer 3, first DBR layer 4, first cladding layer 5, active layer 6, and second cladding layer 7. The current-narrowing region 11a extends from the contact layer 3 to the vicinity of the boundary between the second cladding layer 7 and second DBR layer 8.

The multilayer structure LS has a first main face 61 and a second main face 62 which oppose each other. The multilayer structure LS generates light when a voltage is applied thereto, and emits the light from the rear face (light exit face) 62. Insulating films 19, 20 are formed on the first and second main faces 61 and 62 of the multilayer structure LS, respectively. The insulating films 19, 20 are made of $SiN_x$ and have a thickness of about 0.2 µm for example.

In the multilayer structure LS, a vertical resonator is constructed by the first DBR layer 4 and second DBR layer 8 holding the active layer 6 therebetween. Also, in the multilayer structure LS, the current-narrowing region 11a narrows the current supplied to the active layer 6, thereby limiting a region which emits light. Namely, in the multilayer region 12 positioned on the inside of the current-narrowing region 11a in the light-emitting part 11, the first cladding layer 5, active layer 6, and second cladding layer 7 that are held between the first DBR layer 4 and second DBR layer 8 mainly function as a light-emitting region 11b.

A first electrode 21 is arranged on the first main face 61 of the multilayer structure LS. The first electrode 21 includes a p-side electrode (anode) 23 and a wiring electrode 25. The p-side electrode 23 passes through a contact hole 19a formed in the insulating film 19, so as to be electrically connected to an area positioned on the inside of the current-narrowing region 11a in the contact layer 3. The p-side electrode 23 is made of a multilayer body of Cr/Au and has a thickness of about 1.0 µm. The p-side electrode 23 is arranged so as not to block the light from the light-emitting region 11b. The wiring electrode 25 is arranged on the insulating film 19 so as to be electrically connected to the p-side electrode 23. The wiring electrode 25 is made of a multilayer body of Ti/Pt/Au and has a thickness of about 1.5 µm.

The multilayer structure LS is formed with a through hole TH penetrating therethrough from the first main face 61 to the second main face 62. The insulating film 20 is formed on the wall face of the multilayer structure LS defining the through hole TH. Within the through hole TH, a through lead 27 is provided on the inside of the insulating film 20. One end part 27a of the through lead 27 is electrically connected to the wiring electrode 25 through a contact hole 20a formed in the insulating film 20.

Arranged on the second main face 62 of the multilayer structure LS are a p-side pad electrode 29 (first pad electrode) and a second electrode 31. The p-side pad electrode 29 is made of a multilayer body of Ti/Pt/Au and has a thickness of about 2 μm. The p-side pad electrode 29 is formed so as to cover the through lead 27, and is electrically connected to an end part 27b positioned on the side opposite from the end part 27a in the through lead 27. A bump electrode 41 is arranged on the p-side pad electrode 29. The electrode takeout on the anode side is realized by the contact layer 3, p-side electrode 23, wiring electrode 25, through lead 27, p-side pad electrode 29, and bump electrode 41.

The second electrode 31 includes an n-side pad electrode 33 (second pad electrode). The n-side pad electrode 33 passes through a contact hole 20b formed in the insulating film 20, so as to be electrically connected to the second DBR layer 8. Therefore, the electrode takeout on the cathode side is realized by the n-side pad electrode 33 and a bump electrode 41. The n-side pad electrode 33 is made of a multilayer structure of Ti/Pt/Au and has a thickness of about 2 μm. The bump electrode 41 is arranged on the n-side pad electrode 33 as on the p-side pad electrode 29.

A portion of the n-side pad electrode 33 covers the multilayer region 12 positioned on the inside of the current-narrowing region 11a and the light-emitting region 11b included in the multilayer region 12, and functions as a light-reflecting film. A light-reflecting film may be provided separately from the n-side pad electrode 33.

On the first main face 61 of the multilayer structure LS, a film 10 is formed so as to cover the first electrode 21 (p-side electrode 23 and wiring electrode 25). The film 10 is made of silicon oxide ($SiO_2$) and is optically transparent to light generated in the light-emitting region 11b. In the film 10, the surface 10a on the side opposite from the multilayer structure LS is made flat. The film 10 has a thickness on the order of 3 to 10 μm.

The glass substrate 1 is in contact with and bonded to the surface 10a of the film 10. The glass substrate 1 has a thickness of about 0.3 mm and is optically transparent to emitted light.

The contact layer 3 is a compound semiconductor layer, which is made of GaAs having a carrier concentration of about $1 \times 10^{19}/cm^3$, for example. The contact layer 3 has a thickness of about 0.2 μm. The contact layer 3 also functions as a buffer layer.

The first DBR layer 4 is a mirror layer having a structure in which a plurality of compound semiconductor layers having respective compositions different from each other are alternately laminated. In this embodiment, the first DBR layer 4 is constructed by alternately laminating 20 each of AlGaAs (Al composition: 0.9) layers having a carrier concentration of about $1 \times 10^{18}/cm^3$ and AlGaAs (Al composition: 0.2) layers having a carrier concentration of about $1 \times 10^{18}/cm^3$ on a nondoped AlAs layer. The AlAs layer has a thickness of about 0.1 μm. Each of the AlGaAs (Al composition: 0.9) layers has a thickness of about 0.04 μm, whereas each of the AlGaAs (Al composition: 0.2) layers has a thickness of about 0.02 μm.

The first cladding layer 5 is a compound semiconductor layer, which is made of AlGaAs having a carrier concentration of about $1 \times 10^{18}/cm^3$, for example. The thickness of the first cladding layer 5 is about 0.1 μm.

The active layer 6 is a multiple quantum well (MQW) active layer having a structure in which different compound semiconductor layers are alternately laminated. In this embodiment, the active layer 6 is constructed by alternately three times laminating each of AlGaAs and GaAs layers. Each of the AlGaAs layers has a thickness of about 0.1 μm, whereas each of the GaAs layers has a thickness of about 0.05 μm.

The second cladding layer 7 is a compound semiconductor layer, which is made of AlGaAs having a carrier concentration of about $1 \times 10^{18}/cm^3$, for example. The thickness of the second cladding layer 7 is about 0.1 μm.

As with the first DBR layer 4, the second DBR layer 8 is a mirror layer having a structure in which a plurality of compound semiconductor layers having respective compositions different from each other are alternately laminated. In this embodiment, the second DBR layer 8 is constructed by alternately 30 times laminating each of AlGaAs (Al composition: 0.9) layers having a carrier concentration of about $1 \times 10^{18}/cm^3$ and AlGaAs (Al composition: 0.2) layers having a carrier concentration of about $1 \times 10^{18}/cm^3$, and laminating a nondoped GaAs layer thereon. Each of the AlGaAs (Al composition: 0.9) layers has a thickness of about 0.04 μm, whereas each of the AlGaAs (Al composition: 0.2) layers has a thickness of about 0.02 μm. The GaAs layer functions as a buffer layer, and has a thickness of about 0.01 μm.

When a sufficient voltage is applied between the n-side pad electrode 33 and p-side pad electrode 29 through the two bump electrodes 41, so that a current flows through the light-emitting device LE1, the light-emitting region 11b generates light.

A method of manufacturing the semiconductor light-emitting device LE1 will now be explained with reference to FIGS. 3 to 11. FIGS. 3 to 11 are views for explaining this manufacturing method, illustrating a vertical cross section of the semiconductor light-emitting device LE1. This manufacturing method successively executes the following manufacturing steps (1) to (9):

Step (1)

First, a semiconductor substrate 51 is prepared. For example, the semiconductor substrate 51 has a thickness of 300 to 500 μm and is made of n-type GaAs having a carrier concentration of about $1 \times 10^{18}/cm^3$. On one main face (front face) 81 of the semiconductor substrate 51, an etching stop layer 53, an n-type second DBR layer 8, an n-type second cladding layer 7, an active layer 6, a p-type first cladding layer 5, a p-type first DBR layer 4, and a p-type contact layer 3 are successively grown by metalorganic chemical vapor deposition (MOCVD) method, molecular beam epitaxy (MBE) method, or the like, so as to be laminated (see FIG. 3).

The etching stop layer 53 is made of nondoped AlGaAs (Al composition: 0.5) and has a thickness of about 1.0 μm. The etching stop layer 53 is formed so as to be positioned between the semiconductor substrate 51 and second DBR layer 8. The Al composition ratio of the etching stop layer 53 is preferably at least 0.4. This is because AlGaAs having an Al composition ratio of 0.4 or greater is harder to be etched by an etchant used when etching GaAs which will be explained later.

This step (1) forms the multilayer structure LS and etching stop layer 53 on the front face 81 of the semiconductor substrate 51.

Step (2)

Next, a resist film 55 is formed on the contact layer (multilayer structure LS). The resist film 55 is patterned so as to have an opening at a two-dimensional position corresponding to the current-narrowing region 11a. Photolithography can be used for forming the resist film 55. Thereafter, using the patterned resist film as a mask, an ion implanter implants protons ($H^+$) to the multilayer structure LS. The protons are implanted into the vicinity of the boundary between the second cladding layer 7 and second DBR layer 8. The area implanted with the protons is semi-insulated, whereby a current-narrowing region 11a is formed (see FIG. 4). In place of the protons, oxygen ions ($O^{2-}$) or iron ions ($Fe^{3+}$) may be used as well. Thereafter, the resist film 55 is removed.

Step (3)

Next, an insulating film 19 made of $SiN_x$ is formed on the front face of the contact layer 3 by plasma chemical vapor deposition (PCVD) method. Subsequently, a resist film (not depicted) having an opening at a position corresponding to a p-side electrode 23 is formed on the insulating film 19. Using this resist film as a mask, a part of the insulating film 19 is removed with buffered hydrofluoric acid (BHF), so as to form a contact hole 19a (see FIG. 5). Subsequently, the resist film is removed.

Then, a resist film (not depicted) having an opening at a two-dimensional position corresponding to the contact hole 19a is formed again on the insulating film 19. Thereafter, by vapor deposition using this resist film as a mask and liftoff method, a p-side electrode 23 made of a multilayer body of Cr/Au is formed on the contact layer 3 exposed by forming the contact hole 19a (see FIG. 5). Subsequently, the resist film is removed.

Step (4)

Next, a resist film (not depicted) having an opening at a two-dimensional position corresponding to a wiring electrode 25 is formed. Then, using this resist film as a mask, a wiring electrode 25 made of Ti/Pt/Au is formed by the liftoff method (see FIG. 6). Subsequently, the resist film is removed. Thereafter, sintering is performed in an $H_2$ atmosphere.

Step (5)

Figure 7:
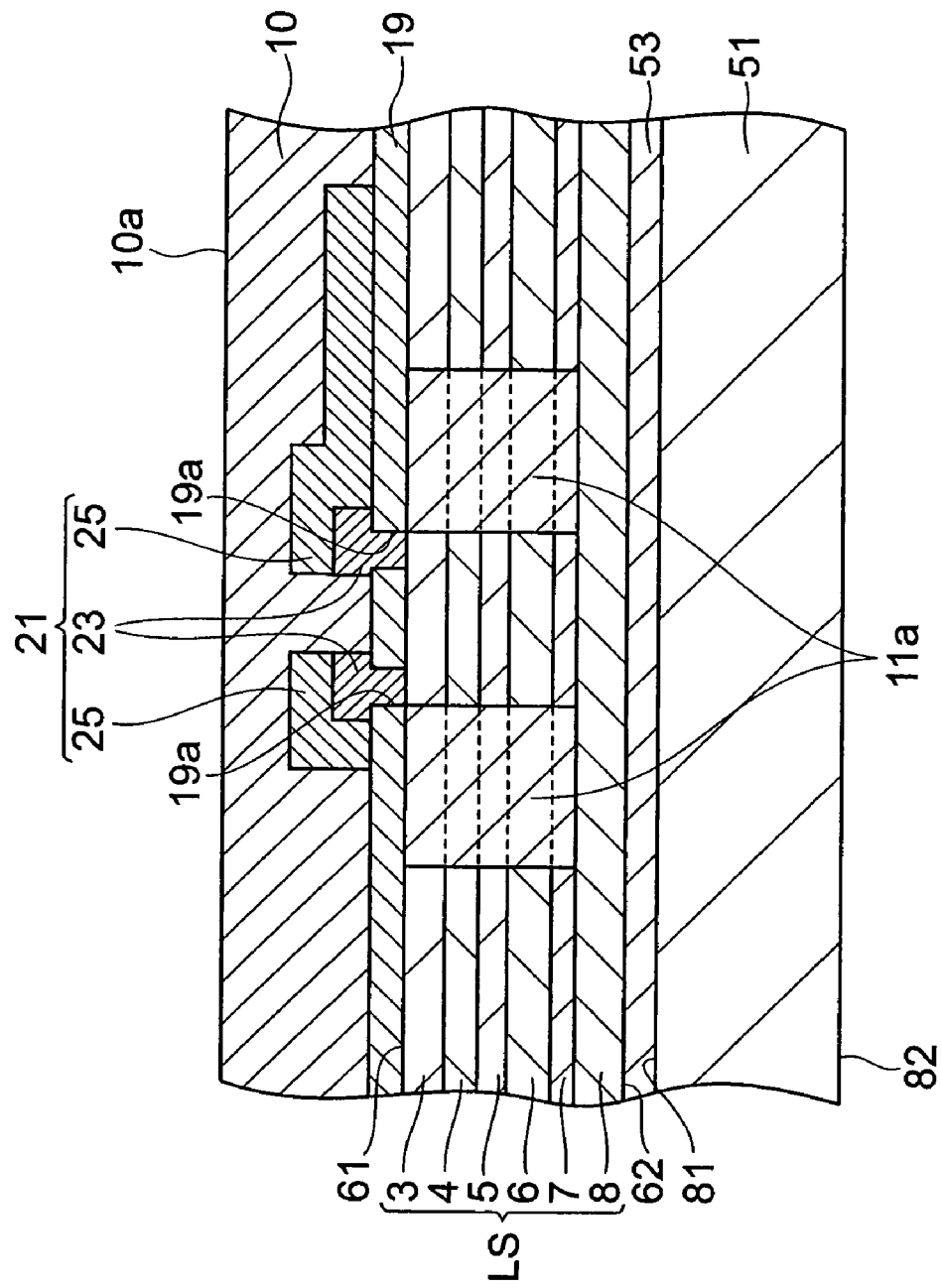
FIG. 7 is a schematic sectional view showing a step of manufacturing the semiconductor light-emitting device in accordance with the first embodiment.

Next, a film 10 is formed on the first main face 61 of the multilayer structure LS so as to cover the first electrode 21 (p-side electrode 23 and wiring electrode 25) and is made flat (see FIG. 7). Here, in the film 10, the surface 10a positioned on the side opposite from the multilayer structure LS is made flat as the front face of the structure including the multilayer structure LS and semiconductor substrate 51. The film 10 can be formed by the PCVD method or coating method. Here, "flat" does not always mean that no irregularities exist at all. Slight irregularities may exist as long as a glass substrate 1 and the film 10 are fused together in a state where the front face of the glass substrate 1 and the surface 10a of the film 10 are in contact with each other when the glass substrate 1 and the semiconductor substrate 51 are pressed and heated while being stacked on each other with the film 10 interposed therebetween in step (6) which will be explained later.

Step (6)

Figure 8:
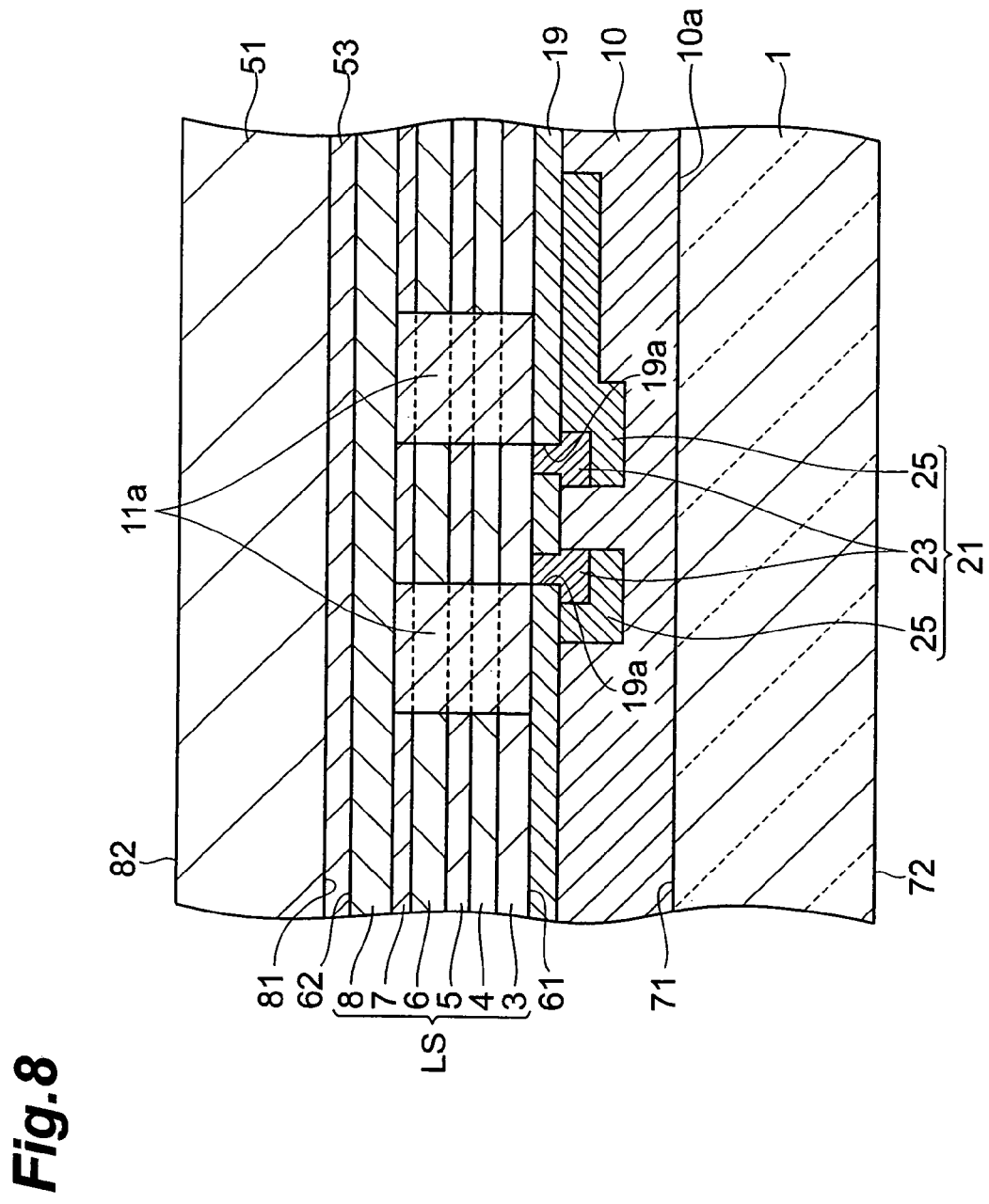
FIG. 8 is a schematic sectional view showing a step of manufacturing the semiconductor light-emitting device in accordance with the first embodiment.
Figure 9:
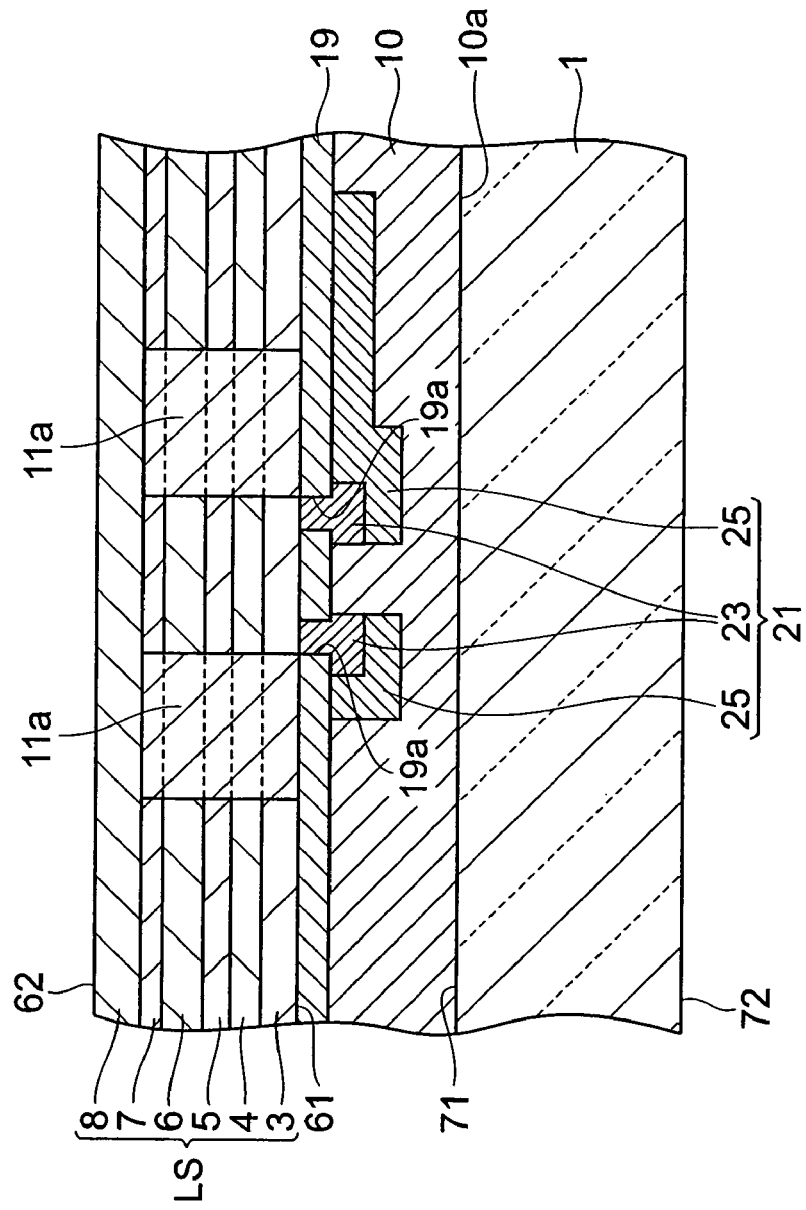
FIG. 9 is a schematic sectional view showing a step of manufacturing the semiconductor light-emitting device in accordance with the first embodiment.

Next, the glass substrate 1 is attached to the semiconductor substrate 51 formed with the multilayer structure LS, etching stop layer 53, and film 10 (see FIG. 8). First, the glass substrate 1 is prepared, and one main face (front face) 71 of the glass substrate 1 is cleaned. Subsequently, the glass substrate 1 and the semiconductor substrate 51 are stacked on each other such that the cleaned front face 71 of the glass substrate 1 and the surface 10a of the film 10 are in contact with each other. Then, the stacked glass substrate 1 and semiconductor substrate 51 are pressed and heated, so that the glass substrate 1 and the film 10 are bonded together by fusion.

Specifically, it will be preferred if the pressure applied to the stacked glass substrate 1 and semiconductor substrate 51 is about 98 kPa, while the heating temperature is 500 to 700° C. Since the topmost film 10 on the semiconductor substrate 51 is made of silicon oxide, the pressing and heating under such a condition fuses the surface 10a of the film 10 to the front face 71 of the glass substrate 1, whereby the multilayer structure LS and semiconductor substrate 51 are secured to the glass substrate 1.

For performing this bonding step, it is desirable that not only the front face 71 of the glass substrate 1 but also the surface 10a of the film 10 be clean. For this purpose, it will be preferred if a contrivance is made, for example, such that a fusing operation is performed immediately after the semiconductor substrate 51 is taken out of the PCVD apparatus having formed the film 10.

Preferably, the glass substrate in use has a coefficient of thermal expansion closer to that of GaAs. This can minimize the stress occurring between the semiconductor substrate 51 and glass substrate 1 because of the difference between their coefficients of thermal expansion in a cooling step after heating, and suppress the decrease in bonding strength and occurrence of crystal defects caused by stresses to the minimum.

Step (7)

Next, the semiconductor substrate 51 is removed. After the multilayer structure LS and semiconductor substrate 51 are secured to the glass substrate 1, the main face of the semiconductor substrate 51 positioned on the side opposite from the glass substrate 1, i.e., the rear face 82, is exposed. In this step, etching is performed from the rear face 82 side of the semiconductor substrate 51, so as to remove the semiconductor substrate 51 and etching stop layer 53 (see FIG. 9).

Specifically, an etchant exhibiting a low etching rate with respect to the etching stop layer 53 is used first, so as remove the semiconductor substrate 51. Subsequently, an etchant which can etch the etching stop layer 53 while exhibiting a low etching rate with respect to the GaAs layer in the second DBR layer 8 is used, so as remove the etching stop layer 53. This yields the glass substrate 1 mounting the multilayer structure LS.

The etchants for use are preferably a mixed solvent (aqueous $NH_4OH$/aqueous $H_2O_2$=1:5) of aqueous ammonia ($NH_4OH$) and aqueous hydrogen peroxide ($H_2O_2$), and hydrochloric acid (HCl). First, the bonded glass substrate 1 and semiconductor substrate 51 are dipped into the mixed solution of aqueous $NH_4OH$ and aqueous $H_2O_2$. This etches the semiconductor substrate 51 from the rear face side. When the etching advances to such an extent that the semiconductor substrate 51 is removed, the etching stop layer 53 is exposed in the etchant. The etching stop layer 53 ($Al_{0.5}Ga_{0.5}As$) is highly resistant to this etchant, so that the etching rate becomes very low. Consequently, the etching automatically stops when the etching stop layer 53 is exposed. Thus, the semiconductor substrate 51 is initially removed.

Subsequently, the glass substrate 1 left with the etching stop layer 53, multilayer structure LS, and the like is taken out from the mixed solution of aqueous $NH_4OH$ and aqueous $H_2O_2$, washed with water, dried, and then dipped in a hydrochloric acid (HCl) solution. For attaining a higher etching rate, it will be preferred if the HCl solution is preheated to about 50° C. Since GaAs is hardly etched by HCl, the etching stop layer 53 is etched alone this time, so that etching automatically stops when the GaAs layer of the second DBR layer 8 is exposed. Thus, the etching stop layer 53 is removed. The semiconductor substrate 51 and etching stop layer 53 may be removed by chemical mechanical polishing (CMP) instead of etching.

Step (8)

Next, a resist film (not depicted) is formed on the second DBR layer 8 (multilayer structure LS). The resist film is patterned so as to have an opening 56 at a two-dimensional position to be formed with a through hole TH. Using this resist film as a mask, the multilayer structure LS and insulating film 19 are etched (wet-etched) until the wiring electrode 25 is exposed. This forms the through hole TH (see FIG. 10). As the etchant for use, aqueous hydrogen peroxide and hydrochloric acid (HCl) are preferred. Subsequently, the resist film is removed.

Figure 10:
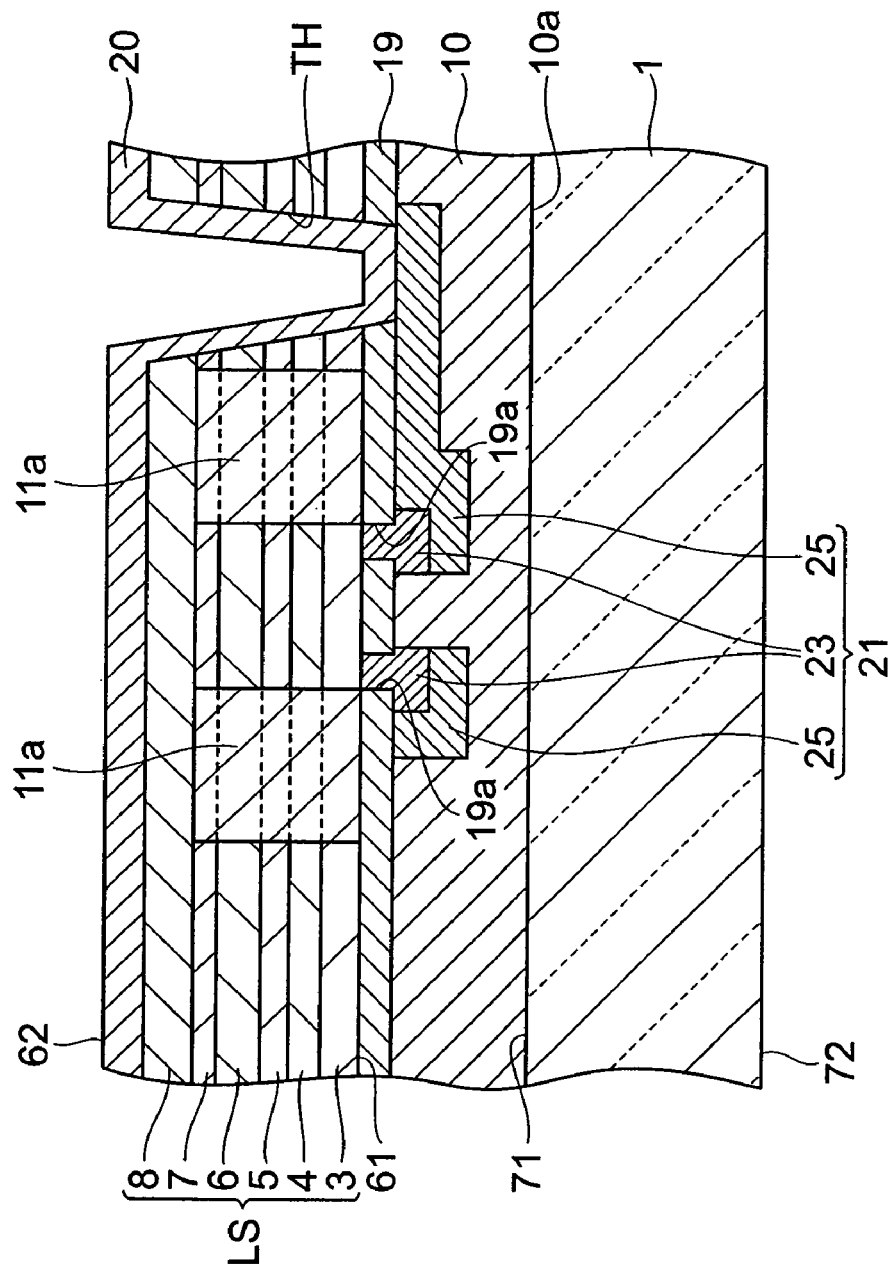
FIG. 10 is a schematic sectional view showing a step of manufacturing the semiconductor light-emitting device in accordance with the first embodiment.
Figure 11:
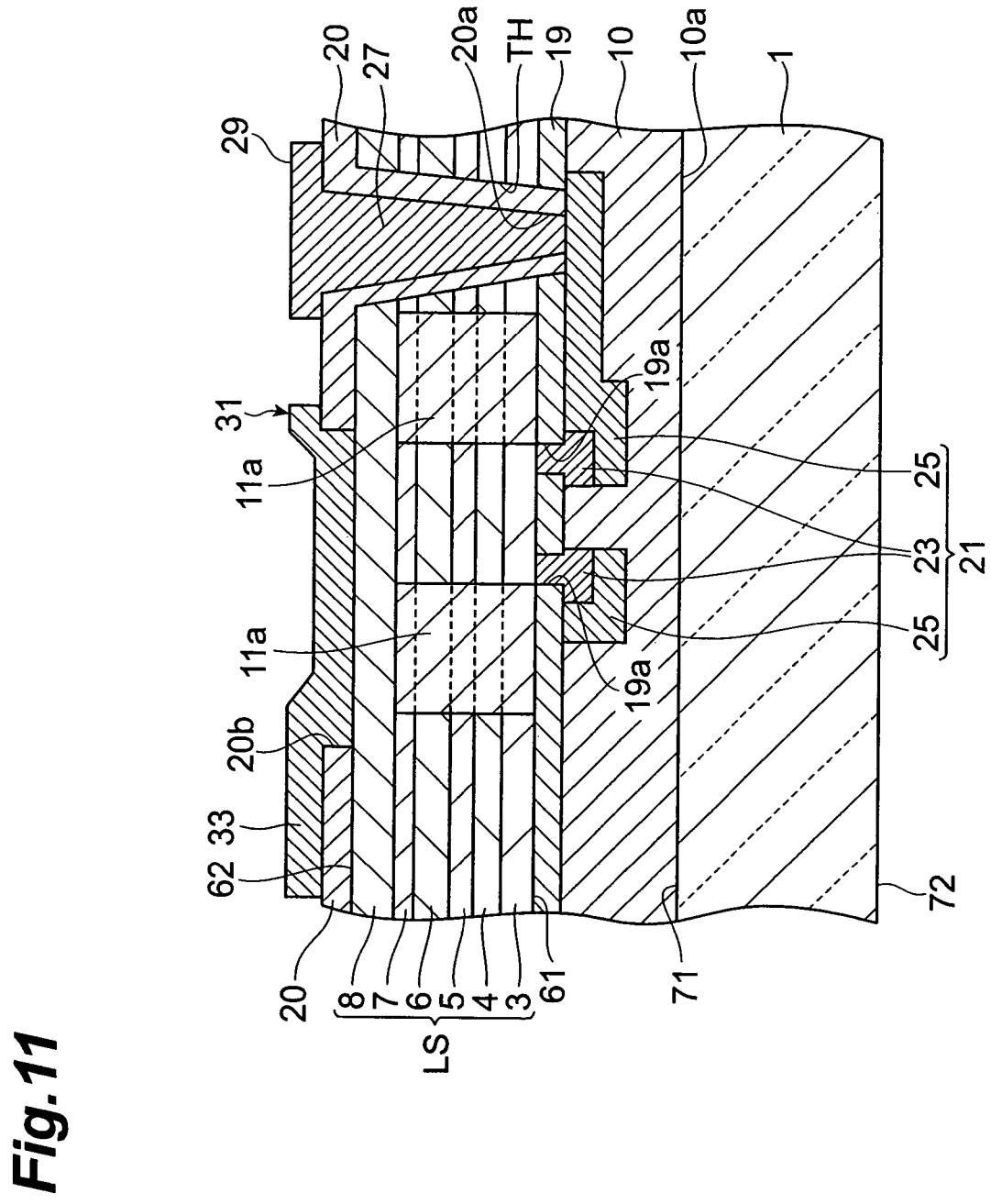
FIG. 11 is a schematic sectional view showing a step of manufacturing the semiconductor light-emitting device in accordance with the first embodiment.

Then, an insulating film 20 made of $SiN_x$ is formed on the front face of the second DBR layer 8 (multilayer structure LS) by the PCVD method (see FIG. 10 as above). This forms the insulating film 20 also on the wall face of the multilayer structure LS defining the through hole TH.

Step (9)

Next, a resist film (not depicted) having respective openings at two-dimensional positions corresponding to a through lead 27 and an n-side pad electrode 33 is formed on the insulating film 20. Then, using this resist film as a mask, the insulating film 20 is removed with BHF, so as to form contact holes 20a and 20b in the insulating film 20 (see FIG. 11). Subsequently, the resist film is removed.

Next, a resist film (not depicted) having respective openings at two-dimensional positions corresponding to a p-side pad electrode 29 (through lead 27) and the n-side pad electrode 33 is formed. Then, using this resist film as a mask, the p-side pad electrode 29, through lead 27, and n-side pad electrode 33 made of Ti/Pt/Au are formed by the liftoff method (see FIG. 11 as above). At this time, the n-side pad electrode 33 is formed so as to cover a light-emitting region 11b. Here, the p-side pad electrode 29 and through lead 27 are formed integrally with each other. Subsequently, the resist film is removed. Thereafter, sintering is performed in an $H_2$ atmosphere. Though the p-side pad electrode 29 and through lead 27 are formed integrally with each other, they may be formed separately from each other without being restricted thereto.

These steps (1) to (9) complete the semiconductor light-emitting device LE1 having the structure shown in FIGS. 1 and 2.

The bump electrodes 41 can also be obtained by forming the n-side pad electrode 29 and p-side pad electrode 33 with solder by plating method, solder ball mounting method, or printing method, and then causing the solder to reflow. The bump electrodes 41 are not limited to the solder, but may be gold bumps, nickel bumps, and copper bumps as well as conductive resin bumps containing metals such as conductive fillers.

In this embodiment, even when the contact layer 3, first DBR layer 4, first cladding layer 5, active layer 6, second cladding layer 7, and second DBR layer 8 are made thin, the mechanical strength of the multilayer structure LS (laminated contact layer 3, first DBR layer 4, first cladding layer 5, active layer 6, second cladding layer 7, and second DBR layer 8) is held by the glass substrate 1. Also, unlike the conventional semiconductor light-emitting devices, it is not necessary to form a part keeping the substrate thickness, whereby the semiconductor light-emitting device LE1 can easily be made smaller.

Since the multilayer structure LS is secured to the glass substrate 1 through the film 10, the glass substrate 1 can be bonded to the multilayer structure LS without using any other adhesives. As with the glass substrate 1, silicon oxide constructing the film 10 is optically transparent to light generated in the multilayer structure LS. Therefore, the light emitted from the multilayer structure LS can reach the glass substrate 1 without being absorbed by adhesives. As a result, the emission output can be prevented from decreasing.

The film 10 is formed so as to cover the first electrode part 21 (p-side electrode 23 and wiring electrode 25) on the first main face 61 of the multilayer structure LS, whereas the surface 10a positioned on the side opposite from the multilayer structure LS is made flat. Therefore, irregularities due to the first electrode 21 arranged on the main face 61 of the multilayer structure LS are eliminated by the film 10. As a result, the glass substrate 1 can be bonded easily and reliably to the first main face 61 of the multilayer structure LS through the film 10.

The first electrode 21 includes the wiring electrode 25, whereas the second electrode 31 includes the n-side pad electrode 33. Through the through hole 27 penetrating through the multilayer structure LS, the wiring electrode 25 is electrically connected to the p-side pad electrode 29 arranged on the second main face 62 of the multilayer structure LS. This arranges the p-side pad electrode 29 and n-side pad electrode 33 on the side opposite from the light exit surface, thereby making it easier to mount the semiconductor light-emitting device LE1.

Since the n-side pad electrode 33 (light-reflecting film) is formed so as to cover the light-emitting region 11b, the light reflected by the n-side pad electrode 33 is also emitted from the glass substrate 1. This can improve the emission output.

In the manufacturing method in accordance with this embodiment, the film 10 is formed on the first main face 61 of the multilayer structure LS so as to cover the first electrode 21, the glass substrate 1 is attached to the film 10, and then the semiconductor substrate 51 is removed. This can easily manufacture the semiconductor light-emitting device LE1 in which the glass substrate 1 is secured to the multilayer structure LS through the film 10.

Since the glass substrate 1 also remains after the semiconductor substrate 51 is removed, the mechanical strength of the multilayer structure LS is held by the glass substrate 1 in subsequent manufacturing steps as well. Before bonding the glass substrate 1, the mechanical strength of the multilayer structure LS is held by the semiconductor substrate 51.

The manufacturing method in accordance with this embodiment comprises the step of forming the etching stop layer 53 such as to position it between the semiconductor substrate 51 and the multilayer structure LS (laminated contact layer 3, first DBR layer 4, first cladding layer 5, active layer 6, second cladding layer 7, and second DBR layer 8) before forming the multilayer structure LS; and the step of removing the etching stop layer 53 by wet etching after removing the semiconductor substrate 51. Therefore, selectively using an etchant adapted to etch the semiconductor substrate 51 but not the etching stop layer 53 and an etchant adapted to etch the etching stop layer 53 but not the multilayer structure LS as appropriate can remove the semiconductor substrate 51 and then the etching stop layer 53 alone. Hence, the semiconductor substrate 51 can be removed reliably and easily while leaving the multilayer structure LS.

Second Embodiment

Figure 12:
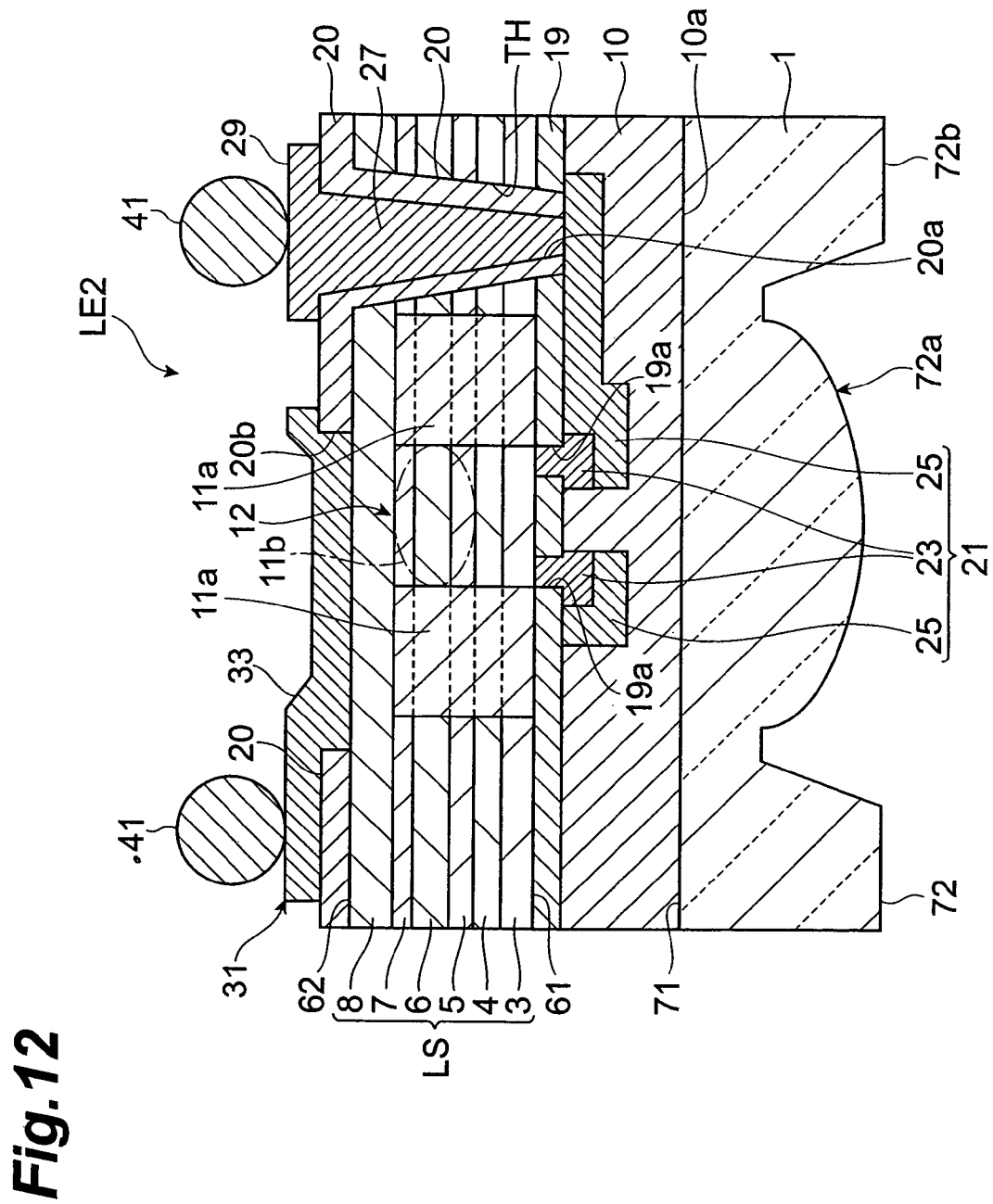
FIG. 12 is a schematic sectional view of the semiconductor light-emitting device in accordance with a second embodiment.

FIG. 12 is a schematic sectional view showing the structure of the semiconductor light-emitting device in accordance with a second embodiment. This semiconductor light-emitting device LE2 differs from the semiconductor light-emitting device LE1 in accordance with the first embodiment in that the glass substrate 1 is formed with a lens part 72a.

The semiconductor light-emitting device LE2 comprises a multilayer structure LS and a glass substrate 1. The semiconductor light-emitting device LE2 is a VCSEL of back emission type which emits light from the glass substrate 1 side.

The semiconductor light-emitting device LE2 is a light-emitting device for short-distance optical communications in the wavelength band of 0.85 µm, for example.

The rear face 72 of the glass substrate 1 is formed with the lens part 72a for receiving the light emitted from the multilayer structure LS. The other part 72b of the rear face 72 is thicker than the lens part 72a. Namely, the lens part 72a is depressed from the thickest part 72b of the rear face 72.

Figure 13:
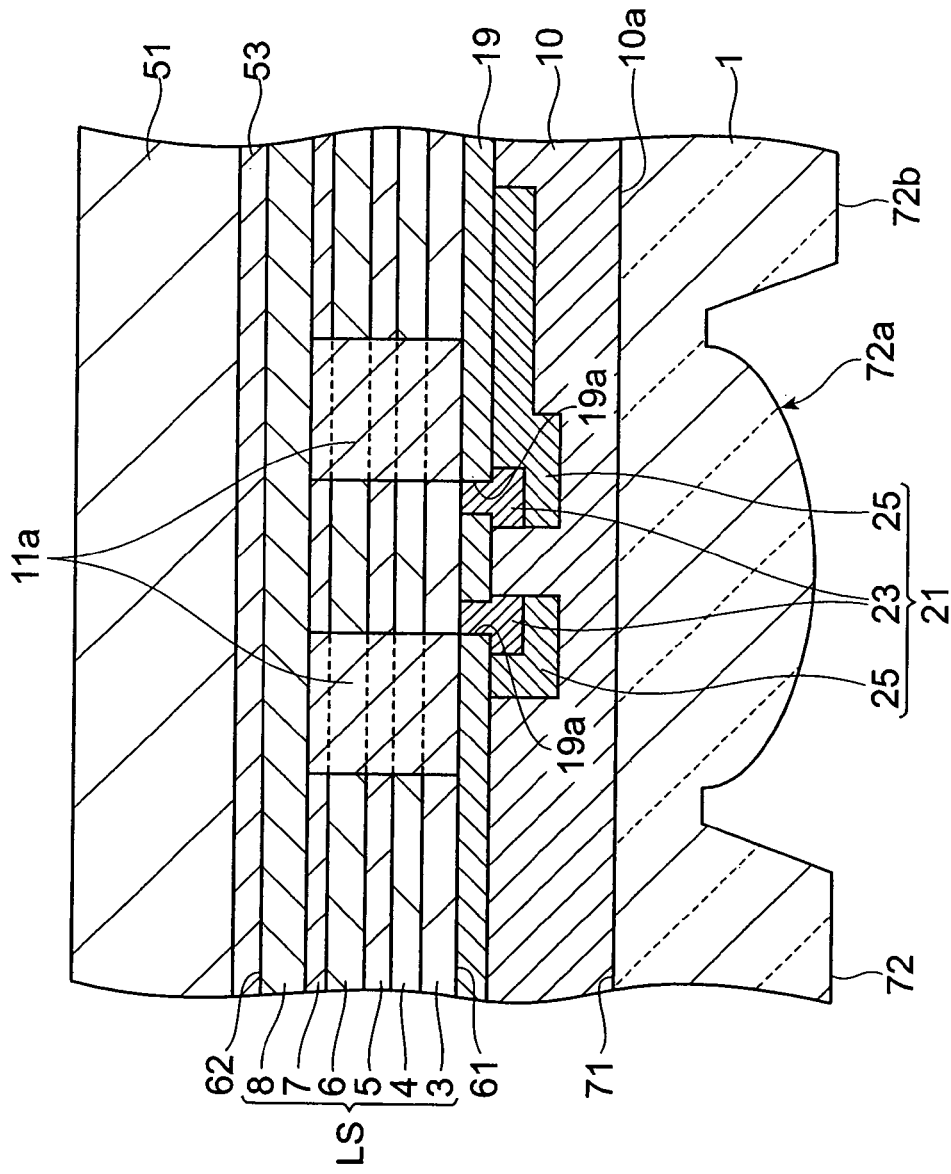
FIG. 13 is a schematic sectional view showing a step of manufacturing the semiconductor light-emitting device in accordance with the second embodiment.
Figure 14:
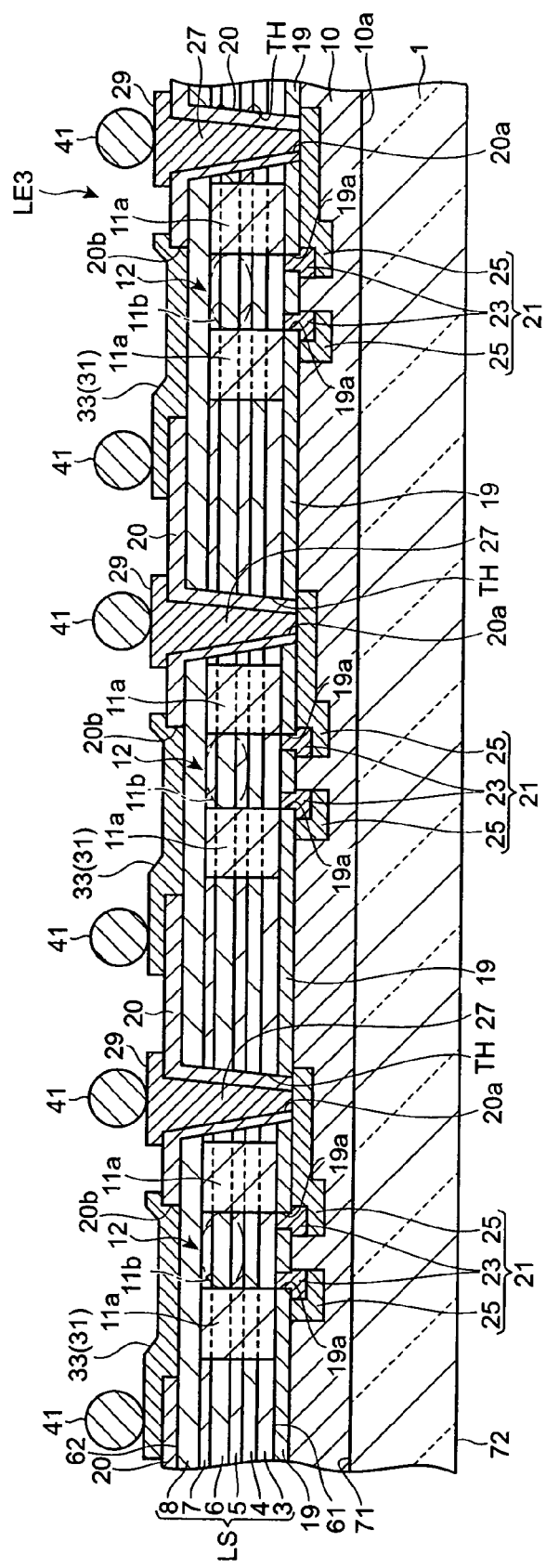
FIG. 14 is a schematic sectional view of the semiconductor light-emitting device array in accordance with an embodiment.
Figure 15:
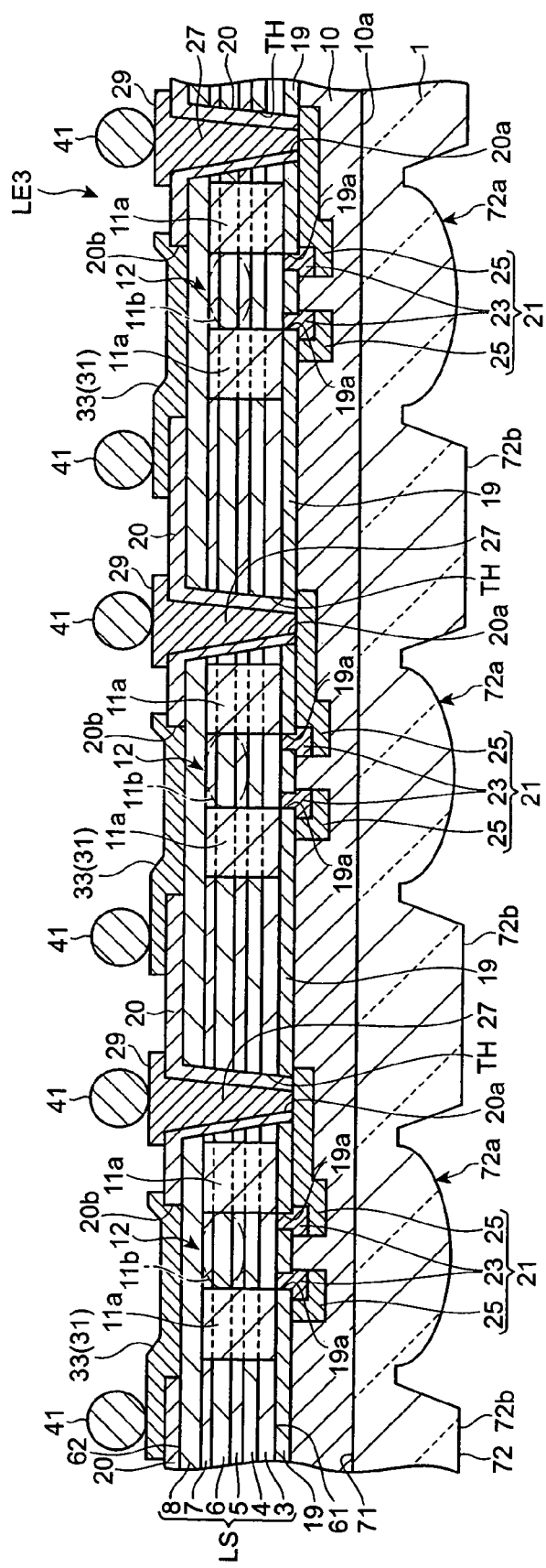
FIG. 15 is a schematic sectional view of the semiconductor light-emitting device array in accordance with an embodiment.
Figure 16:
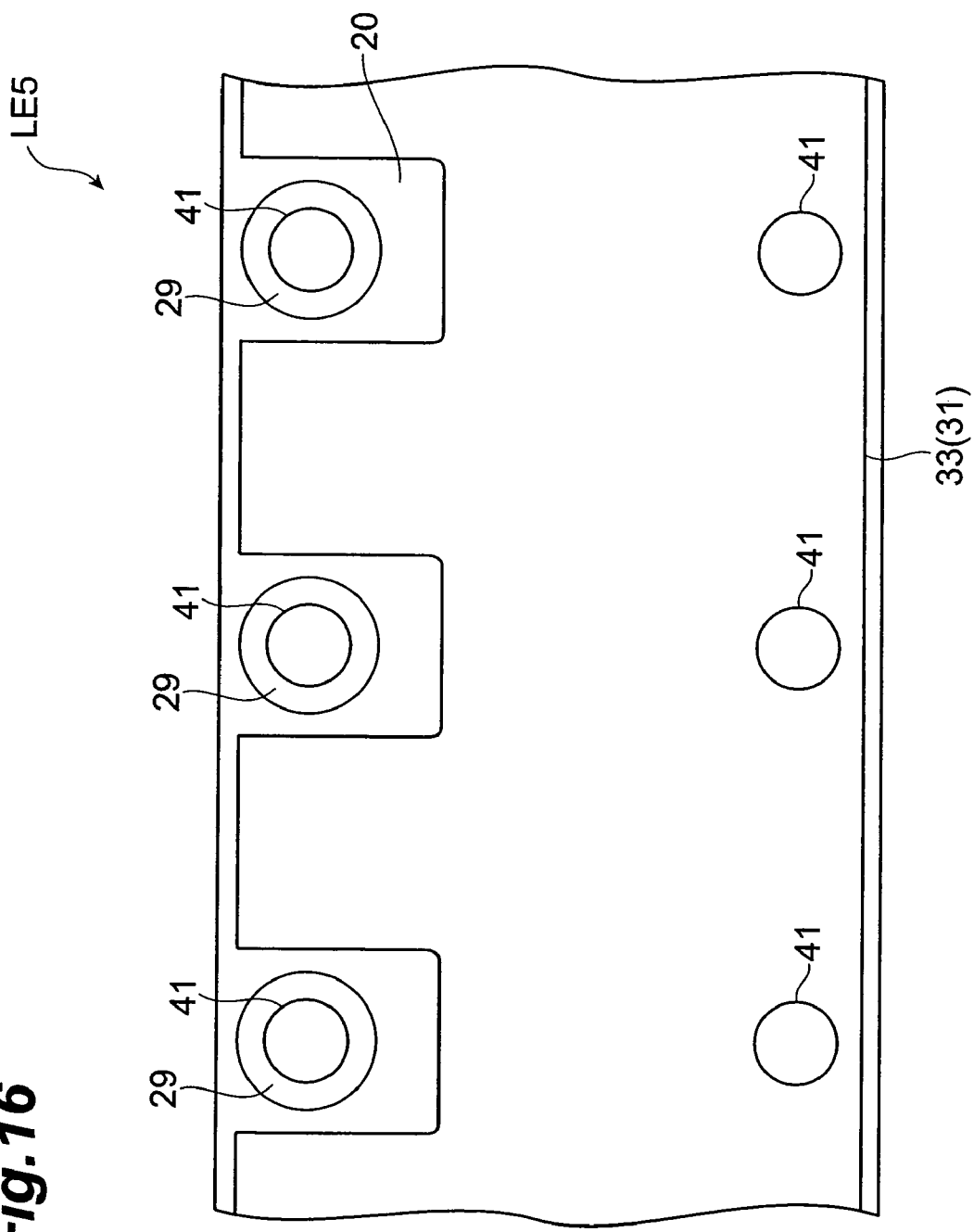
FIG. 16 is a schematic plan view of the semiconductor light-emitting device array in accordance with an embodiment.
Figure 17:
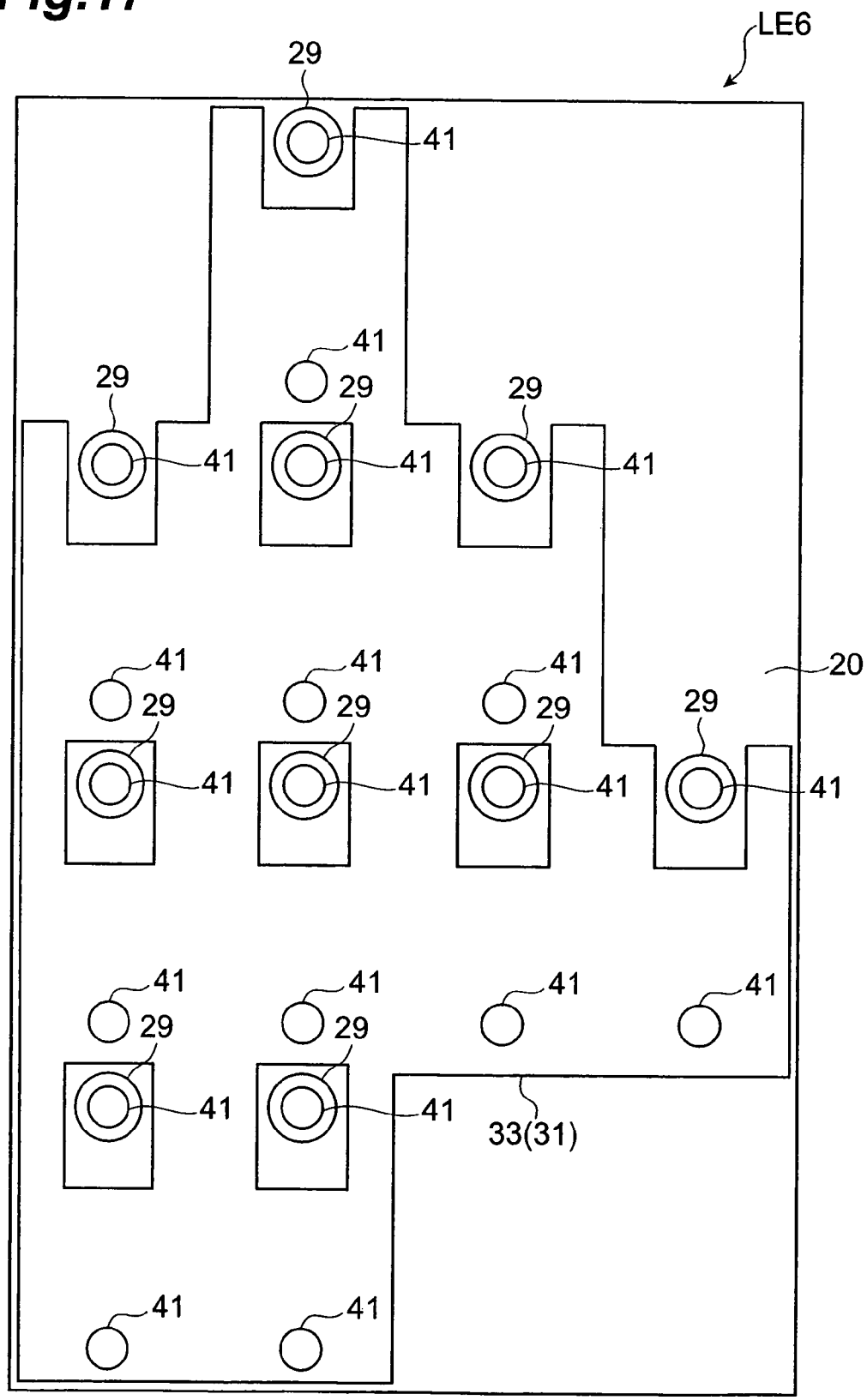
FIG. 17 is a schematic plan view of the semiconductor light-emitting device array in accordance with an embodiment.

With reference to FIG. 13, a method of manufacturing the semiconductor light-emitting device LE2 will now be explained. FIG. 13 is a view for explaining this manufacturing method, illustrating a vertical cross section of the semiconductor light-emitting device.

This manufacturing method successively executes the following steps (1) to (9). Steps (1) to (5) are the same as steps (1) to (5) in the first embodiment, and thus will not be explained.

Step (6)

Next, the glass substrate 1 is bonded to the semiconductor substrate 51 formed with the etching stop layer 53 and film 10 (see FIG. 13). The bonding method is the same as that in step (6) in the first embodiment. Specifically, the glass substrate 1 having the rear face 72 formed with the lens part 72a is prepared, and the front face 71 of the glass substrate 1 is cleaned. Subsequently, the glass substrate 1 and semiconductor substrate 51 are stacked on each other such that the cleaned front face 71 of the glass substrate 1 and the surface 10a on the side remote from the multilayer structure LS in the film 10 on the semiconductor substrate 51 come into contact with each other. Then, the stacked glass substrate 1 and semiconductor substrate 51 are pressed and heated, so that the glass substrate 1 and film 10 are fused and bonded to each other. Details of this bonding method are the same as those in step (6) in the first embodiment.

With reference to a marker provided on the rear face 72 side of the glass substrate 1, the light-emitting region 11b on the semiconductor substrate 51 and the lens part 72a on the glass substrate 1 can easily be aligned with each other by using a double-sided aligner. Instead of providing the marker, the outer form of the lens part 72a may be utilized as a marker.

Steps (7) to (9) are the same as steps (7) to (9) in the first embodiment, and thus will not be explained here. These steps (1) to (9) complete the semiconductor light-emitting device LE2 having the structure shown in FIG. 12.

In this embodiment, as in the above-mentioned first embodiment, the mechanical strength of the multilayer structure LS (laminated contact layer 3, first DBR layer 4, first cladding layer 5, active layer 6, second cladding layer 7, and second DBR layer 8) is held by the glass substrate 1, and the semiconductor light-emitting device LE2 can easily be made smaller.

Further, the glass substrate 1 is provided with the lens part 72a in this embodiment. This can improve the directivity of the emitted light and form parallel light.

The lens part 72a is formed such as to be depressed from the thickest part 72b in the rear face 72. Therefore, the glass substrate 1 formed with the lens part 72a can easily be bonded to the multilayer structure LS. Also, since the lens part 72a can be processed before bonding, the processing method is less restricted, which achieves a higher degree of freedom in designing lenses in terms of lens forms and the like.

The lens part 72a may be formed after bonding the glass substrate 1 to the semiconductor substrate 51 mounting the multilayer structure LS, etching stop layer 53, and film 10. In view of the degree of freedom in lens designs, however, it will be preferred if the glass substrate 1 formed with the lens part 72a beforehand is bonded to the semiconductor substrate 51.

With reference to FIGS. 14 to 17, modified examples of the embodiments will now be explained. These modified examples relate to semiconductor light-emitting device arrays LE3 to LE6 each comprising a plurality of multilayer regions 12, arranged in a row, including light-emitting regions 11b. These light-emitting device arrays LE3 to LE6 are of so-called back emission type.

In the light-emitting device arrays LE3 to LE6, as respectively shown in FIGS. 14 to 17, a plurality of multilayer regions 12 are arranged one- or two-dimensionally. In the light-emitting device arrays LE3 to LE6, n-side pad electrodes 33 are electrically connected to each other.

In the light-emitting device arrays LE3 to LE6, as in the above-mentioned first and second embodiments, the mechanical strength of the multilayer structure LS (laminated contact layer 3, first DBR layer 4, first cladding layer 5, active layer 6, second cladding layer 7, and second DBR layer 8) is held by the glass substrate 1. Also, the pitch between the light-emitting regions 11b can be narrowed, whereby the light-emitting device arrays LE3 to LE6 can easily be made smaller.

An optical interconnection system using the above-mentioned semiconductor light-emitting devices (or semiconductor light-emitting device arrays) will now be explained with reference to FIG. 18. FIG. 18 is a schematic view showing the structure of the optical interconnection system.

The optical interconnection system 101 is a system which transmits optical signals between a plurality of modules (e.g., CPUs, IC chips, and memories) M1 and M2, and includes a semiconductor light-emitting device LE1, a driving circuit 103, an optical waveguide substrate 105, a semiconductor photodetecting device 107, an amplifier circuit 109, and the like. A photodetecting device of back entrance type can be used as the semiconductor photodetecting device 107. The module M1 is electrically connected to the driving circuit 103 through bump electrodes. The driving circuit 103 is electrically connected to the semiconductor light-emitting device LE1 through bump electrodes 41. The semiconductor photodetecting device 107 is electrically connected to the amplifier circuit 109 through bump electrodes. The amplifier circuit 109 is electrically connected to the module M2 through bump electrodes.

An electric signal outputted from the module M1 is sent to the driving circuit 103, and is converted into an optical signal by the semiconductor light-emitting device LE1. The optical signal from the semiconductor light-emitting device LE1 passes the optical waveguide 105a on the optical waveguide substrate 105, so as to enter the semiconductor photodetecting device 107. The optical signal is converted by the semiconductor photodetecting device 107 into an electric signal, which is then sent to the amplifier circuit 109 and amplified thereby. The amplified electric signal is sent to the module M2. Thus, the electric signal outputted from the module M1 is transmitted to the module M2.

The semiconductor light-emitting device LE2 or the semiconductor light-emitting device arrays LE3 to LE6 may be used instead of the semiconductor light-emitting device LE1. When the semiconductor light-emitting device arrays LE3 to LE6 are used, driving circuits 103, optical waveguide substrates 105, semiconductor photodetecting devices 107, and amplifier circuits 109 are also arranged so as to form an array.

The present invention is not limited to the above-mentioned embodiments. For example, thicknesses, materials, and the like of the contact layer 3, first DBR layer 4, first cladding layer 5, active layer 6, second cladding layer 7, second DBR layer 8, and the like are not limited to those mentioned above. Also, the configuration of the multilayer structure LS is not limited to the above-mentioned embodiments as long as it includes a plurality of laminated compound semiconductor layers.

From the invention thus described, it will be obvious that the embodiments of the present invention may be varied in many ways. Such variations are not to be regarded as a departure from the scope of the invention, and all such modifications as would be obvious to one skilled in the art are intended to be included within the scope of the following claims.

INDUSTRIAL APPLICABILITY

The present invention can provide a semiconductor light-emitting device which has a sufficient mechanical strength and can be made smaller, and a method of manufacturing the same.

The invention claimed is:

1. A method of manufacturing a semiconductor light-emitting device comprising the steps of:
    preparing a semiconductor substrate;
    providing a multilayer structure for generating light onto the semiconductor substrate, the multilayer structure including a plurality of laminated compound semiconductor layers and having first and second main faces opposing each other, the second main face facing the semiconductor substrate;
    forming a first electrode on the first main face of the multilayer structure;
    forming a film made of silicon oxide so as to cover the first electrode;
    preparing a glass substrate, optically transparent to the light generated by the multilayer structure, having front and rear faces, and fusing the film made of silicon oxide to the front face of the glass substrate, so as to secure the multilayer structure to the glass substrate;
    removing the semiconductor substrate; and
    forming a second electrode on the second main face of the multilayer structure.

2. A method of manufacturing a semiconductor light-emitting device according to claim 1, further comprising the step of flattening the film made of silicon oxide before securing the multilayer structure to the glass substrate after forming the film made of silicon oxide.

3. A method of manufacturing a semiconductor light-emitting device according to claim 1, wherein the step of removing the semiconductor substrate includes the step of removing the semiconductor substrate by wet etching.

4. A method of manufacturing a semiconductor light-emitting device according to claim 3, further comprising the steps of:
    forming an etching stop layer for stopping the wet etching on the semiconductor substrate before the step of forming the multilayer structure; and
    removing the etching stop layer by wet etching after the step of removing the semiconductor substrate;
    wherein the step of forming the multilayer structure includes the step of forming the multilayer structure on the etching stop layer.

5. A method of manufacturing a semiconductor light-emitting device according to claim 1, wherein the multilayer structure includes a contact layer of a first conductive type, a first distributed Bragg reflector (DBR) layer of the first conductive type, a first cladding layer of the first conductive type, an active layer, a second cladding layer of a second conductive type, and a second DBR layer of the second conductive type as the plurality of compound semiconductor layers; and
    wherein the step of forming the multilayer structure includes the step of successively laminating the second DBR layer, second cladding layer, active layer, first cladding layer, first DBR layer, and contact layer on the semiconductor substrate;
    the method further comprising the step of forming an insulated or semi-insulated current-narrowing region surrounding a multilayer region partially including the contact layer, first DBR layer, first cladding layer, active layer, and second cladding layer in the multilayer structure after the step of forming the multilayer structure.

6. A method of manufacturing a semiconductor light-emitting device according to claim 5, wherein the step of forming the first electrode includes the step of forming a wiring electrode electrically connected to a part included in the multilayer region in the contact layer after the step of forming the current-narrowing region; and
    wherein the step of forming the second electrode includes the step of forming a second pad electrode electrically connected to the second DBR layer;
    the method further comprising the step of forming a first pad electrode on the second main face of the multilayer structure and electrically connecting the first pad electrode and the wiring electrode to each other after the step of removing the semiconductor substrate.

7. A method of manufacturing a semiconductor light-emitting device according to claim 6, wherein the step of electrically connecting the first pad electrode and wiring electrode to each other includes the step of forming a through lead penetrating through the multilayer structure, and electrically connecting the first pad electrode to the wiring electrode through the through lead.

8. A method of manufacturing a semiconductor light-emitting device according to claim 5, further comprising the step of forming a light-reflecting film covering the multilayer region onto the second DBR layer.

9. A method of manufacturing a semiconductor light-emitting device according to claim 1, wherein the rear face of the glass substrate has a lens part for receiving the light emitted from the multilayer structure.

10. A method of manufacturing a semiconductor light-emitting device according to claim 9, wherein the lens part is depressed from the thickest part in the rear face of the glass substrate.

* * * * *

UNITED STATES PATENT AND TRADEMARK OFFICE
CERTIFICATE OF CORRECTION

PATENT NO. : 8,048,700 B2
APPLICATION NO. : 12/654983
DATED : November 1, 2011
INVENTOR(S) : Akimasa Tanaka It is certified that error appears in the above-identified patent and that said Letters Patent is hereby corrected as shown below:

Cover Page:

In Section (73) "Assignee" on the front page of the above-identified patent, change "Hamamatsu-shi Photonics K.K." to --Hamamatsu Photonics K.K.--

Signed and Sealed this
Thirty-first Day of January, 2012

David J. Kappos
*Director of the United States Patent and Trademark Office*